US008937015B2

(12) United States Patent
Wang et al.

(10) Patent No.: US 8,937,015 B2
(45) Date of Patent: Jan. 20, 2015

(54) METHOD FOR FORMING VIAS IN A SUBSTRATE

(75) Inventors: Meng-Jen Wang, Kaohsiung (TW); Chung-Hsi Wu, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 120 days.

(21) Appl. No.: 13/085,311

(22) Filed: Apr. 12, 2011

(65) Prior Publication Data

US 2011/0189852 A1      Aug. 4, 2011

Related U.S. Application Data

(63) Continuation-in-part of application No. 12/241,219, filed on Sep. 30, 2008, now abandoned.

(30) Foreign Application Priority Data

Dec. 4, 2007   (TW) ............................... 96146101 A

(51) Int. Cl.
*H01L 21/44*       (2006.01)
*H01L 21/768*      (2006.01)
*H01L 23/48*       (2006.01)

(52) U.S. Cl.
CPC ........ *H01L 21/76898* (2013.01); *H01L 23/481* (2013.01)
USPC .................................. 438/675; 257/E21.158

(58) Field of Classification Search
CPC ................ H01L 2924/10253; H01L 2924/00; H01L 2924/00014; H01L 21/76898; H01L 21/486; H01L 23/49827; H01L 2224/02372
USPC ............................ 438/622, 675; 257/E21.158
See application file for complete search history.

(56) References Cited

U.S. PATENT DOCUMENTS

| 5,308,443 A | 5/1994  | Sugihara     |
| 5,998,292 A | 12/1999 | Black et al. |

(Continued)

FOREIGN PATENT DOCUMENTS

| CN | 1684256   | 10/2005 |
| CN | 101281883 | 10/2008 |

(Continued)

OTHER PUBLICATIONS

Office Action dated Jan. 4, 2012, with abstract for counterpart CN Patent Application No. 2010101444216.7 (8 pages).

(Continued)

*Primary Examiner* — Kimberly Rizkallah
*Assistant Examiner* — Duy T Nguyen
(74) *Attorney, Agent, or Firm* — Foley & Lardner LLP; Cliff Z. Liu; Angela D. Murch

(57) ABSTRACT

The present invention relates to a method for forming a via in a substrate which includes the flowing steps of: (a) providing a substrate having a first surface and a second surface; (b) forming an accommodating groove and a plurality of pillars on the first surface of the substrate, the accommodating groove having a side wall and a bottom wall, the pillars remaining on the bottom wall of the accommodating groove; (c) forming a first insulating material in the accommodating groove and between the pillars; (d) removing the pillars so as to form a plurality of grooves in the first insulating material; and (e) forming a first conductive metal in the grooves. As a result, thicker insulating material can be formed in the via, and the thickness of the insulating material in the via is even.

16 Claims, 34 Drawing Sheets

(56) References Cited

U.S. PATENT DOCUMENTS

| | | |
|---|---|---|
| 6,700,175 B1 | 3/2004 | Kodama et al. |
| 6,809,421 B1 | 10/2004 | Hayasaka et al. |
| 7,222,420 B2 | 5/2007 | Moriizumi |
| 7,276,787 B2 | 10/2007 | Edelstein et al. |
| 7,772,116 B2 | 8/2010 | Akram et al. |
| 2003/0176058 A1 | 9/2003 | Weidman et al. |
| 2003/0219975 A1* | 11/2003 | Koutny et al. ............... 438/637 |
| 2004/0259292 A1 | 12/2004 | Beyne et al. |
| 2006/0001174 A1 | 1/2006 | Matsui |
| 2006/0118965 A1 | 6/2006 | Matsui |
| 2006/0281307 A1* | 12/2006 | Trezza ........................ 438/672 |
| 2007/0048896 A1 | 3/2007 | Andry et al. |
| 2007/0184654 A1* | 8/2007 | Akram et al. ............... 438/675 |
| 2008/0041621 A1 | 2/2008 | Hsu et al. |
| 2008/0164573 A1* | 7/2008 | Basker et al. ............... 257/621 |
| 2009/0032866 A1* | 2/2009 | McDaniel .................... 257/330 |
| 2010/0038749 A1* | 2/2010 | Summerfelt ................ 257/531 |

FOREIGN PATENT DOCUMENTS

| | | |
|---|---|---|
| JP | 2005219588 | 8/2005 |
| JP | 2007036060 | 2/2007 |
| TW | 200416897 | 9/2004 |
| TW | 200501386 | 1/2005 |
| TW | I239594 | 9/2005 |
| TW | 200707667 | 2/2007 |
| TW | 200715438 | 4/2007 |
| TW | I278263 | 4/2007 |
| TW | 200926259 | 6/2009 |

OTHER PUBLICATIONS

TIPO Office Action dated Apr. 10, 2013 for TW Patent Application No. 098146109, Applicant Advanced Semiconductor Engineering, Inc., with English translation (7 pages).

* cited by examiner

METHOD FOR FORMING VIAS IN A SUBSTRATE

CROSS REFERENCE TO RELATED APPLICATIONS

This application is a continuation-in-part of U.S. patent application Ser. No. 12/241,219, filed on Sep. 30, 2008 and abandoned on Jul. 15, 2008, and Taiwan Application No. 096146101, filed on Dec. 4, 2007.

BACKGROUND OF THE INVENTION

1. Field of the Invention

The present invention relates to a method for forming a via in a substrate and a substrate with a via, and more particularly to a method for forming an insulating layer on a side wall of a via in a substrate by utilizing a polymer and a substrate with the via.

2. Description of the Related Art

FIGS. 1 to 3 show schematic views of a conventional method for forming a via in a substrate. First, referring to FIG. 1, a substrate 1 is provided. The substrate 1 has a first surface 11 and a second surface 12. Afterward, a plurality of grooves 13 are formed on the first surface 11 of the substrate 1. An insulating layer 14 is then formed on the side wall of the grooves 13 by chemical vapor deposition, and a plurality of accommodating spaces 15 are formed. The material of the insulating layer 14 is usually silicon dioxide.

Afterward, referring to FIG. 2, the accommodating spaces 15 are filled with a conductive metal 16. The material of the conductive metal 16 is usually copper. Finally, the first surface 11 and the second surface 12 of the substrate 1 are ground or etched so as to expose the conductive metal 16, as shown in FIG. 3.

In the conventional method, the insulating layer 14 is formed by chemical vapor deposition, so that the thickness of the insulating layer 14 on the side wall of the grooves 13 is limited, and is usually under 0.5 m. Moreover, the thickness of the insulating layer 14 on the side wall of the grooves 13 is not even, that is, the thickness of the insulating layer 14 on the upper side wall of the grooves 13 is not exactly equal to that on the lower side wall of the grooves 13. Thus, the electrical capacity is not uniform.

Therefore, it is necessary to provide a method for forming a via in a substrate to solve the above problems.

SUMMARY OF THE INVENTION

The present invention is directed to a method for forming a via in a substrate, comprising: (a) providing a substrate having a first surface and a second surface; (b) forming an accommodating groove and a plurality of pillars on the first surface of the substrate, the accommodating groove having a side wall and a bottom wall, the pillars remaining on the bottom wall of the accommodating groove; (c) forming a first insulating material in the accommodating groove and between the pillars; (d) removing the pillars so as to form a plurality of grooves in the first insulating material; and (e) forming a first conductive metal in the grooves.

In the present invention, thicker insulating material can be formed in the via. Also, the thickness of the insulating material in the via is even. Moreover, the polymer is used as an insulating material in the present invention, so polymers with different materials can be chosen for specific processes.

DETAILED DESCRIPTION OF THE INVENTION

Figure 1:
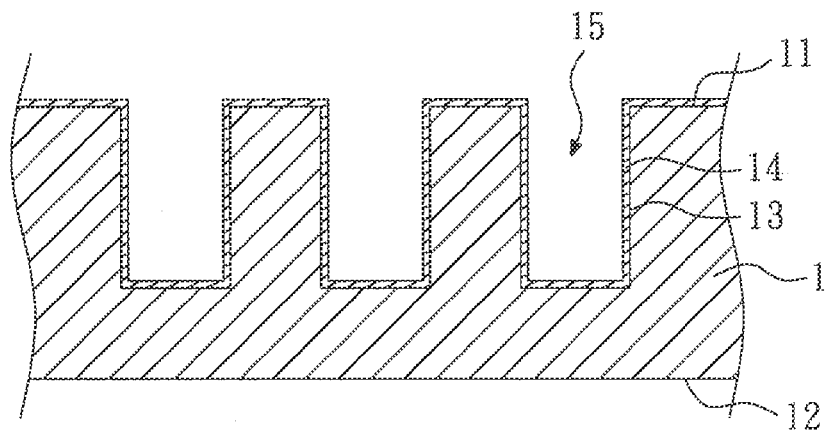
FIGS. 1 to 3 are schematic views of a conventional method for forming a via in a substrate.
Figure 2:
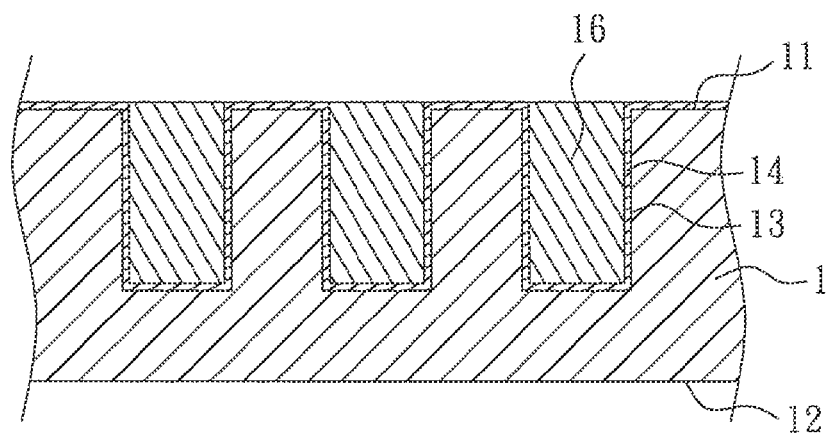
Figure 3:
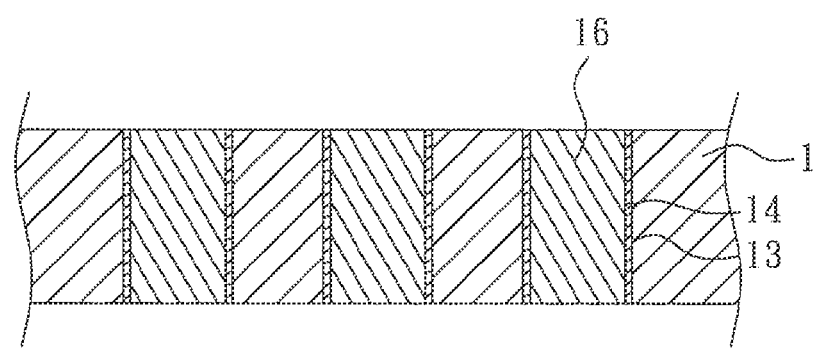
Figure 4:
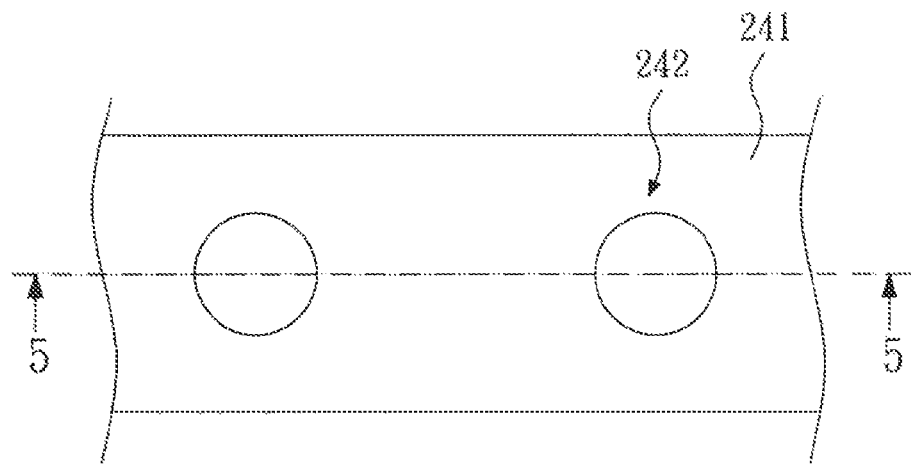
FIGS. 4 to 21 are schematic views of a method for forming a via in a substrate according to a first embodiment of the present invention.
Figure 5:
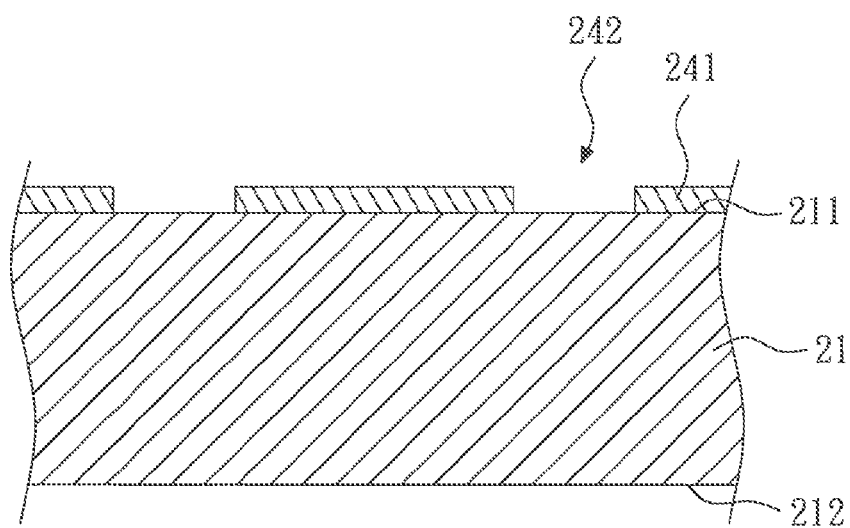

FIGS. 4 to 21 show schematic views of a method for forming a via in a substrate according to a first embodiment of the present invention. Referring to FIG. 4, a top view of the substrate, and FIG. 5, a cross-sectional view along line 5-5 in FIG. 4, first, a substrate 21 is provided. The substrate 21 has a first surface 211 and a second surface 212. The substrate 21 is, for example, a wafer or a silicon substrate. Afterward, a groove 231 (FIG. 6) is formed on the first surface 211 of the substrate 21. The groove 231 has a side wall 232 and a bottom wall 233. In the embodiment, a first photo resist layer 241 is formed on the first surface 211 of the substrate 21, and a first opening 242 is formed on the first photo resist layer 241.

Figure 6:
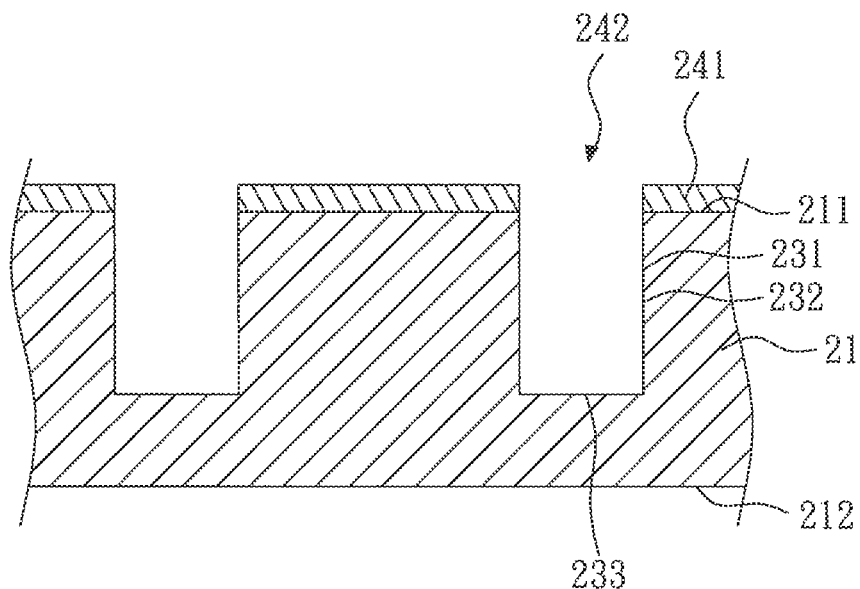

Referring to FIG. 6, the groove 231 is formed on the substrate 21 by etching according to the first opening 242. The groove 231 is disposed on the first surface 211 of the substrate 21, and has the side wall 232 and the bottom wall 233. The first photo resist layer 241 is then removed.

Figure 7:
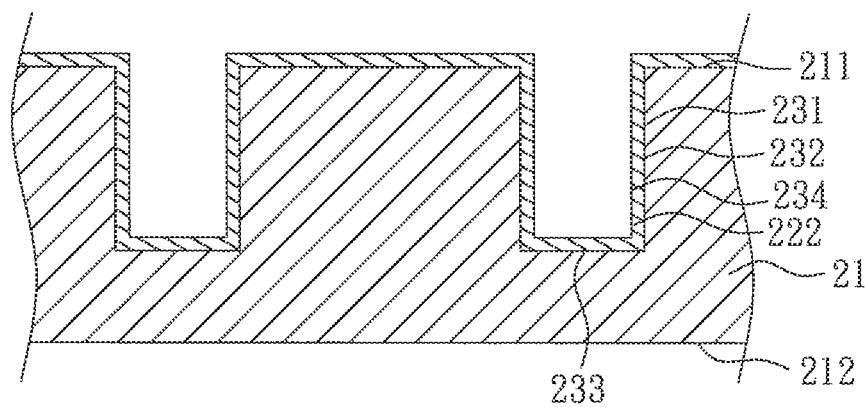

Referring to FIG. 7, a first conductive metal 222 is formed on the side wall 232 and the bottom wall 233 of the groove 231 and the first surface 211 of the substrate 21 by electroplating, so as to form a central groove 234. In the embodiment, the material of the first conductive metal 222 is copper.

Afterward, referring to FIGS. 8 to 12, a center insulating material 223 is formed in the central groove 234. In the embodiment, the center insulating material 223 is a polymer 263. In the present invention, the method for forming the center insulating material 223 in the central groove 234 includes but is not limited to the following three methods.

Figure 8:
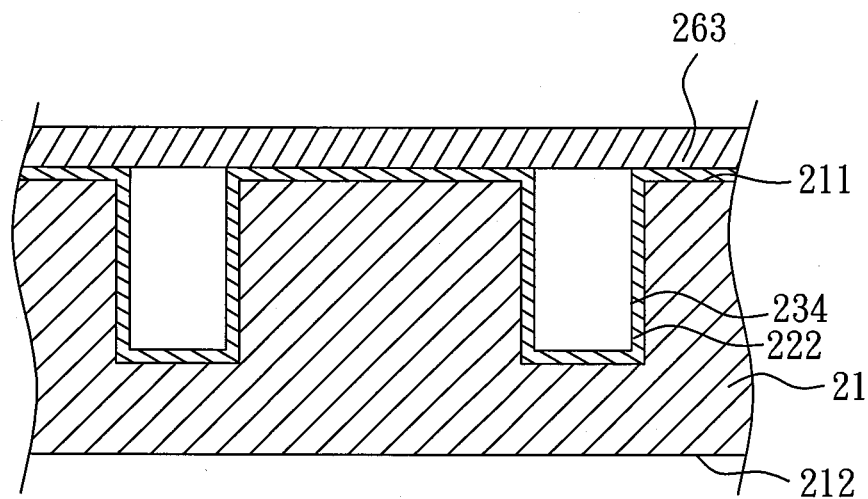
Figure 9:
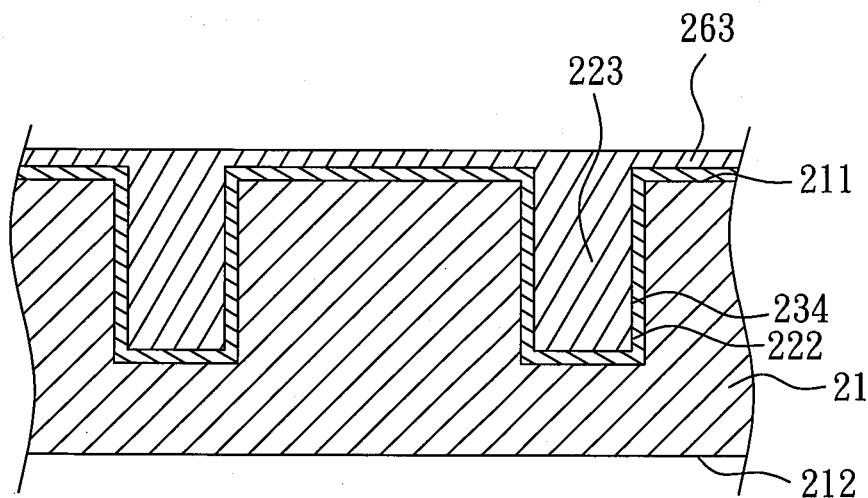

The first method is that the polymer 263 is dispersed on the first surface 211 of the substrate 21, and the position of the polymer 263 corresponds to the central groove 234, as shown in FIG. 8. Alternatively, the polymer 263 can be partially dispersed at a position corresponding to the central groove 234. Afterward, the polymer 263 is impelled into the central groove 234 by vacuuming so as to form the center insulating material 223, as shown in FIG. 9.

Figure 10:
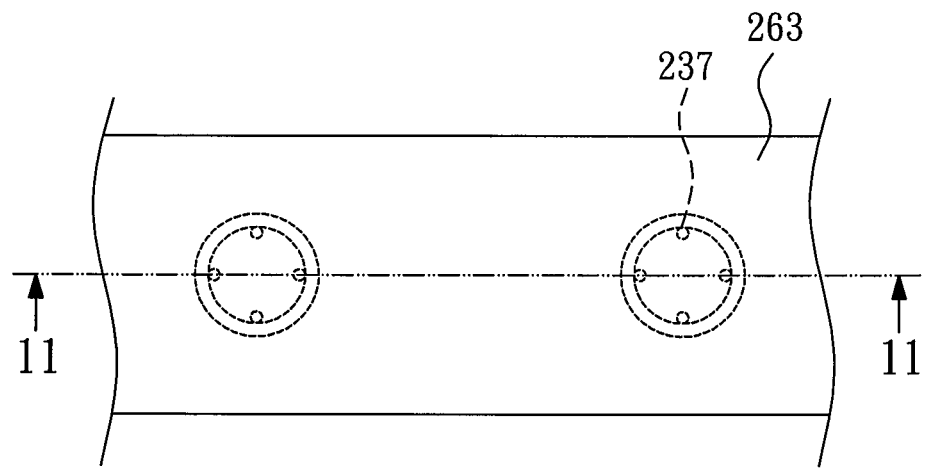
Figure 11:
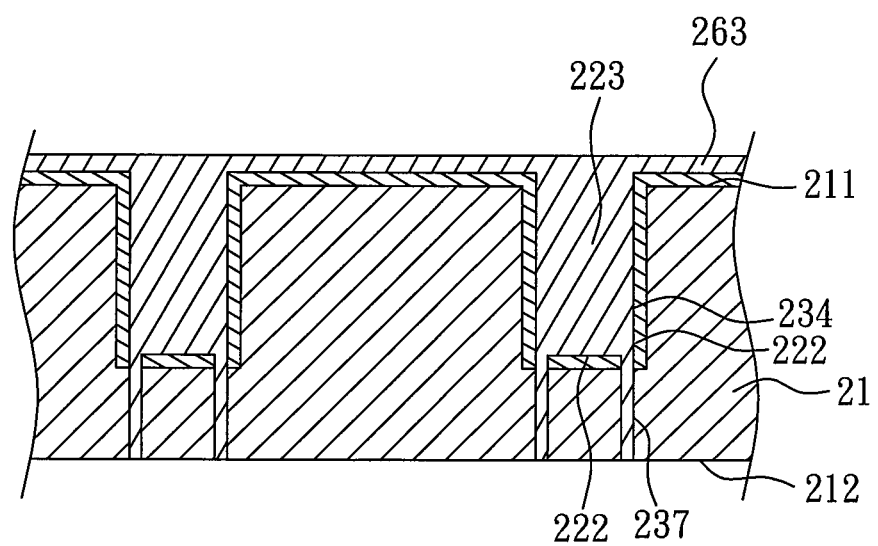

The second method is that a plurality of first vents 237 are formed to connect the central groove 234 to the second surface 212 of the substrate 21, as shown in FIG. 10, a top view of the substrate 21, and FIG. 11, a cross-sectional view along line 11-11 in FIG. 10. Afterward, the polymer 263 is dispersed on the first surface 211 of the substrate 21, and the position of the polymer 263 corresponds to the central groove 234. Alternatively, the polymer 263 can be partially dispersed at a position corresponding to the central groove 234. The central groove 234 and the first vents 237 are then filled with the polymer 263 so as to form the center insulating material 223.

Figure 12:
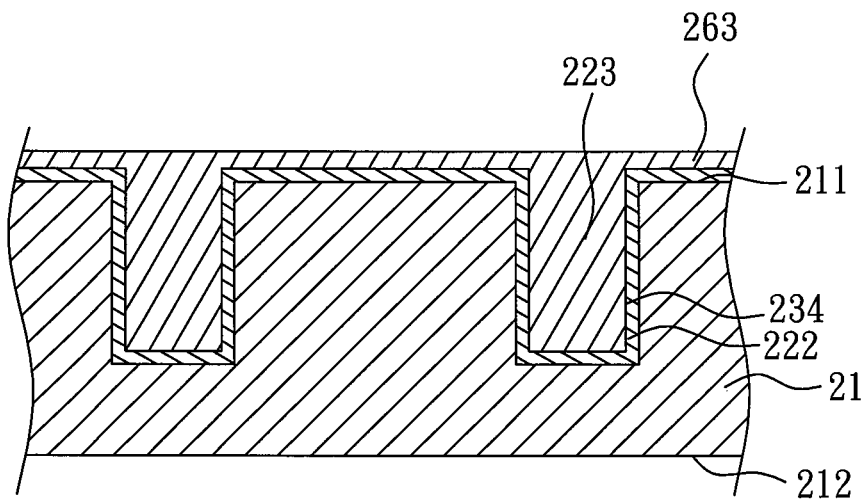

The third method is that the polymer 263 is atomized and deposited in the central groove 234 by spray coating so as to form the center insulating material 223, as shown in FIG. 12.

Figure 13:
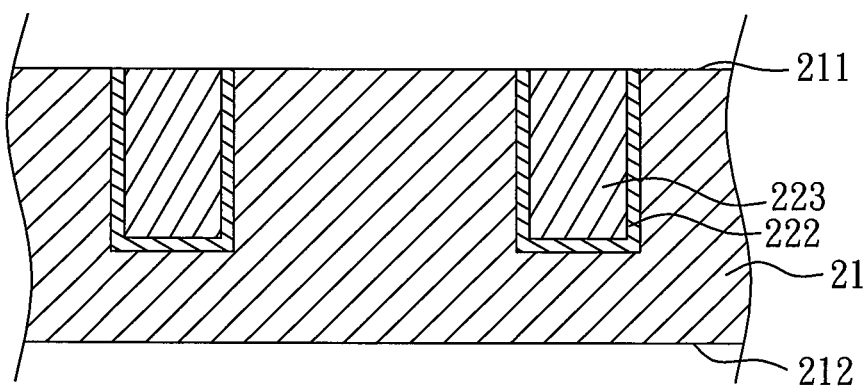

Afterward, referring to FIG. 13, the first conductive metal 222 and the center insulating material 223 disposed on the first surface 211 of the substrate 21 are removed by etching or grinding.

Figure 14:
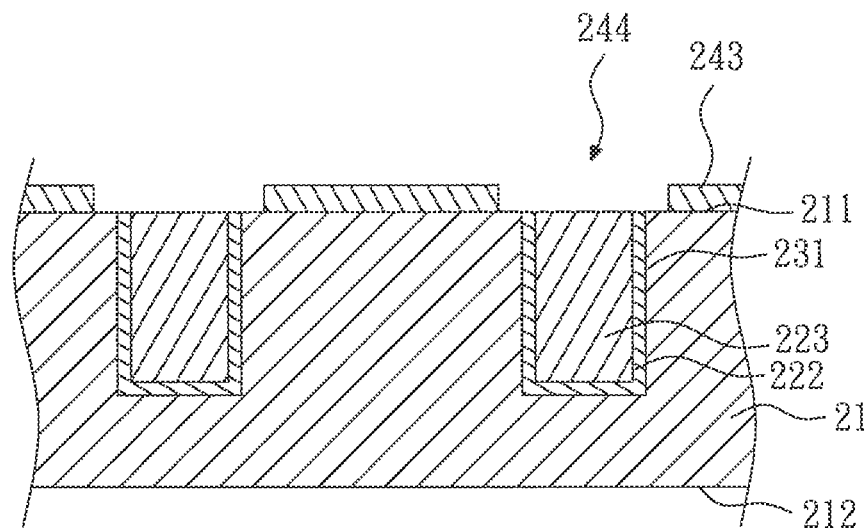
Figure 15:
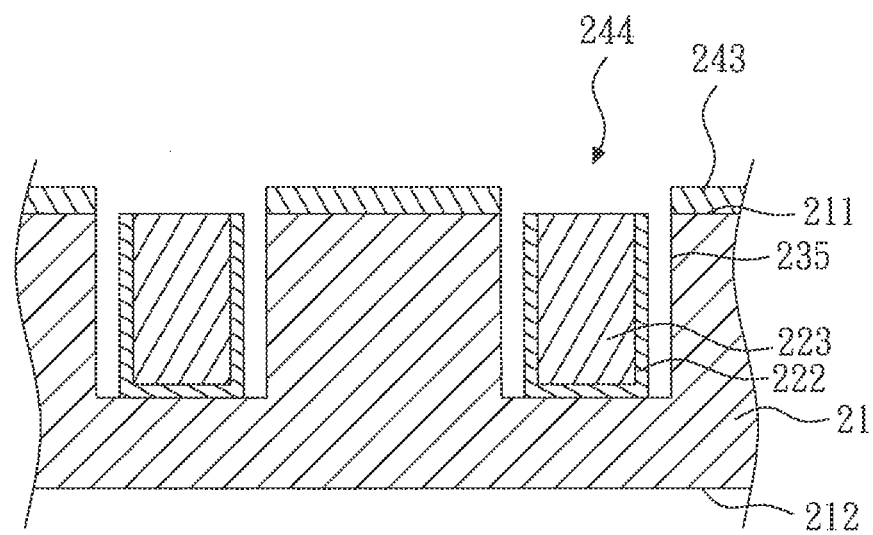

Referring to FIGS. 14 and 15, an annular groove 235 is formed on the first surface 211 of the substrate 21. The annular groove 235 surrounds the first conductive metal 222. Referring to FIG. 14, in the embodiment, a second photo resist layer 243 is formed on the first surface 211 of the substrate 21, and a second opening 244 is formed on the second photo resist layer 243. The position of the second opening 244 corresponds to the groove 231, and the diameter of the second opening 244 is larger than that of the groove 231. Afterward, referring to FIG. 15, the annular groove 235 is formed on the substrate 21 by etching according to the second opening 244. The annular groove 235 surrounds the first conductive metal 222, and does not penetrate the substrate 21. The second photo resist layer 243 is then removed.

Referring to FIGS. 16 to 20, a first insulating material 221 is formed in the annular groove 235. In the embodiment, the first insulating material 221 is polymer 261. In the present invention, the method for forming the first insulating material 221 in the annular groove 235 includes but is not limited to the following three methods.

Figure 16:
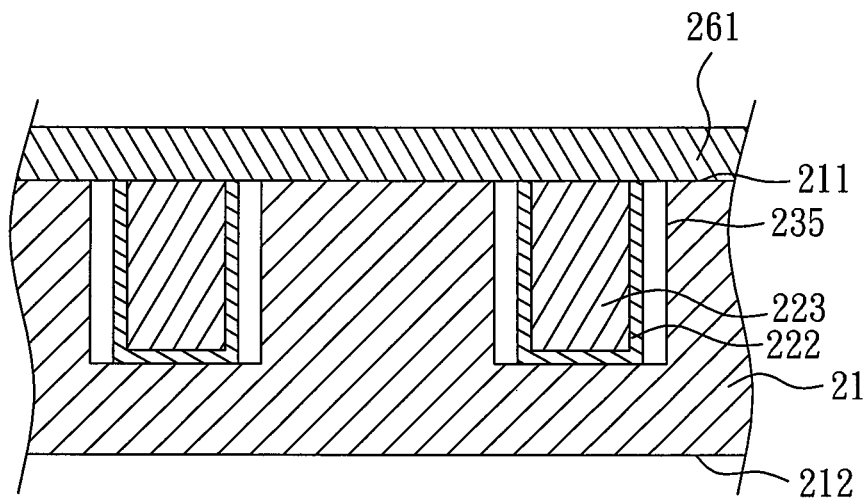
Figure 17:
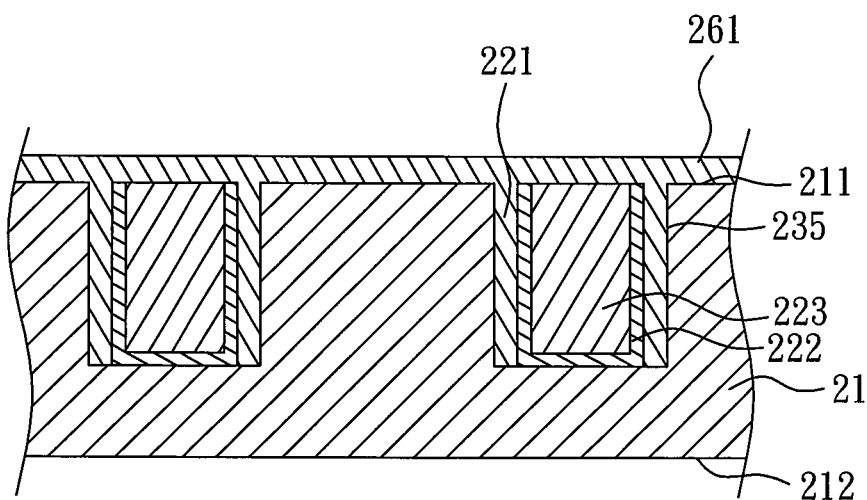

The first method is that the polymer 261 is dispersed on the first surface 211 of the substrate 21, and the position of the polymer 261 corresponds to the annular groove 235, as shown in FIG. 16. Alternatively, the polymer 261 can be partially dispersed at a position corresponding to the annular groove 235. Afterward, the polymer 261 is impelled into the annular groove 235 by vacuuming so as to form the first insulating material 221, as shown in FIG. 17.

Figure 18:
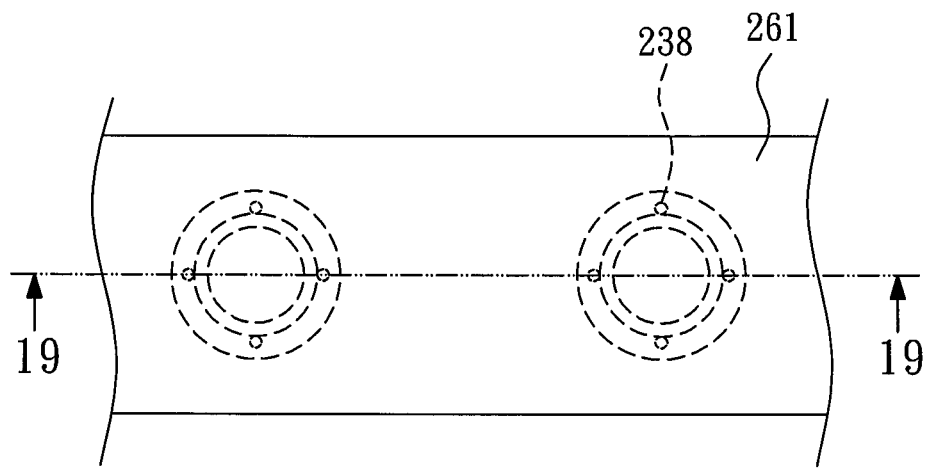
Figure 19:
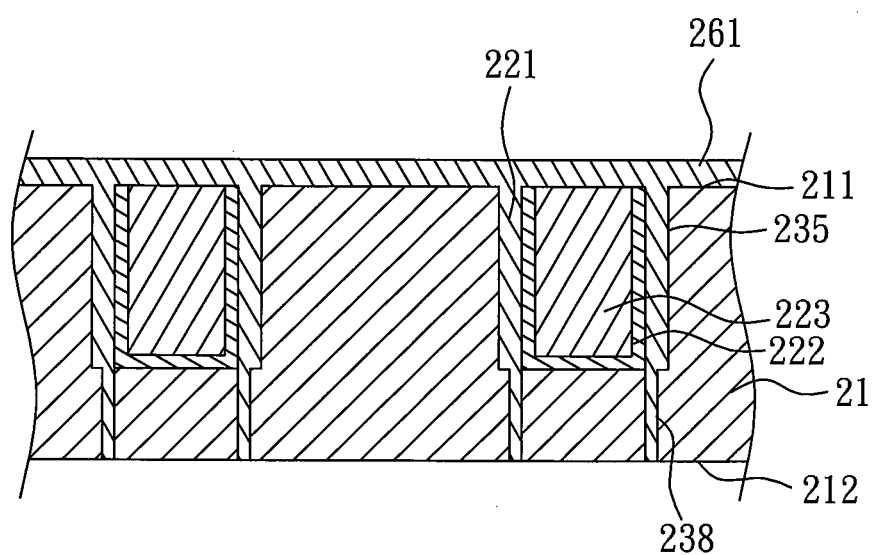

The second method is that a plurality of second vents 238 are formed to connect the annular groove 235 to the second surface 212 of the substrate 21, as shown in FIG. 18, a top view of the substrate 21, and FIG. 19, a cross-sectional view along line 19-19 in FIG. 18. Afterward, the polymer 261 is dispersed on the first surface 211 of the substrate 21, and the position of the polymer 261 corresponds to the annular groove 235. Alternatively, the polymer 261 can be partially dispersed at a position corresponding to the annular groove 235. The annular groove 235 and the second vents 238 are then filled with the polymer 261 so as to form the first insulating material 221.

Figure 20:
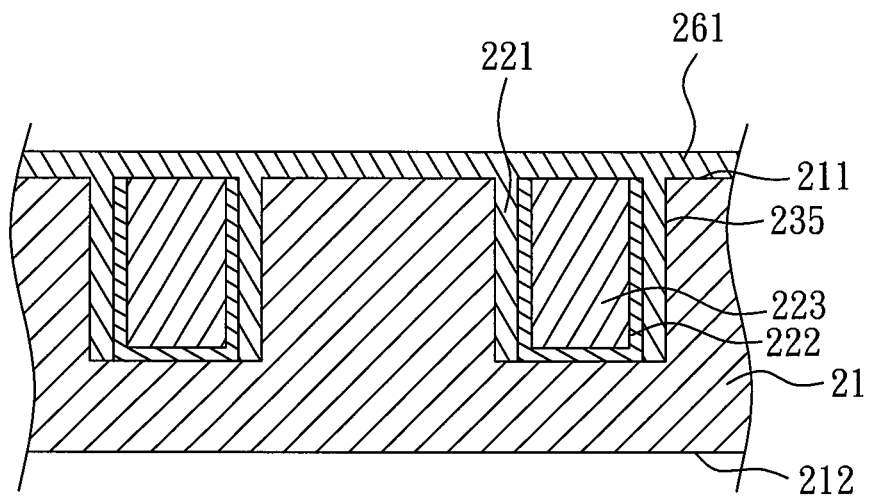

The third method is that the polymer 261 is atomized and deposited in the annular groove 235 by spray coating so as to form the first insulating material 221, as shown in FIG. 20.

Figure 21:
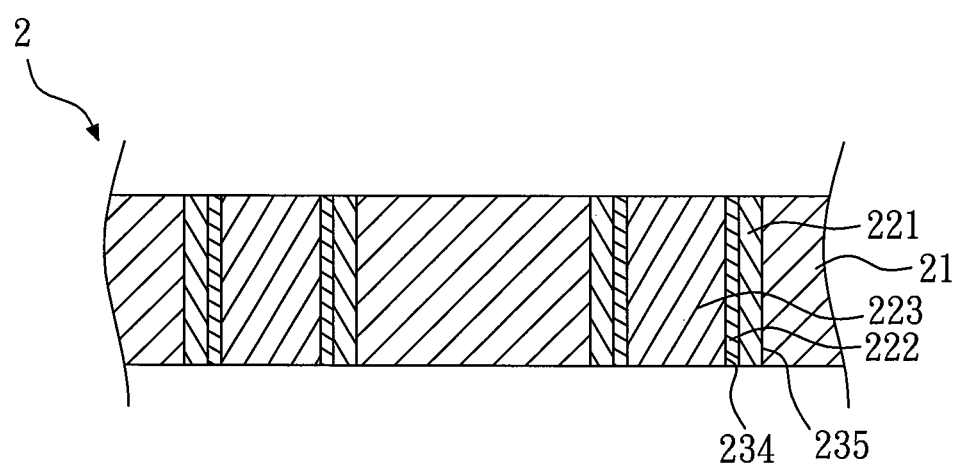

Afterward, referring to FIG. 21, part of the first surface 211 and part of the second surface 212 of the substrate 21 are removed by etching or grinding so as to expose the first conductive metal 222, the center insulating material 223 and the first insulating material 221. A substrate 2 with a via according to the first embodiment of the present invention is formed. In the embodiment, the via is formed by the center insulating material 223, the first conductive metal 222 and the first insulating material 221. In the present invention, thicker insulating material (the center insulating material 223 and the first insulating material 221) can be formed in the central groove 234 and the annular groove 235 of the via. Also, the thickness of the insulating material in the central groove 234 and the annular groove 235 of the via is even. Moreover, the polymer is used as an insulating material in the present invention, so polymers with different materials can be chosen for specific processes.

Figure 22:
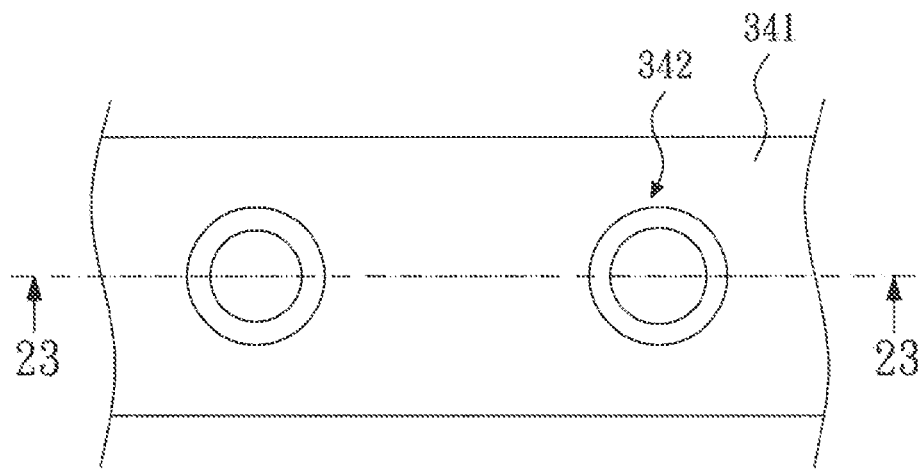
FIGS. 22 to 39 are schematic views of a method for forming a via in a substrate according to a second embodiment of the present invention.

FIGS. 22 to 39 show schematic views of a method for forming a via in a substrate according to a second embodiment of the present invention. Referring to FIG. 22, a top view of the substrate, and FIG. 23, a cross-sectional view along line 23-23 in FIG. 22, first, a substrate 31 is provided. The substrate 31 has a first surface 311 and a second surface 312. The substrate 31 is, for example, a wafer or a silicon substrate. Afterward, referring to FIG. 24, an annular groove 335 and a pillar 336 are formed on the first surface 311 of the substrate 31, and the annular groove 335 surrounds the pillar 336.

Figure 23:
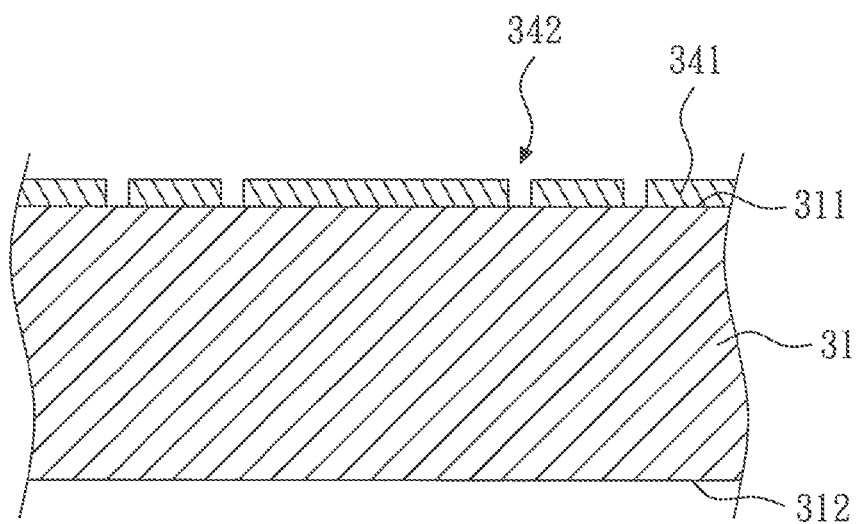
Figure 24:
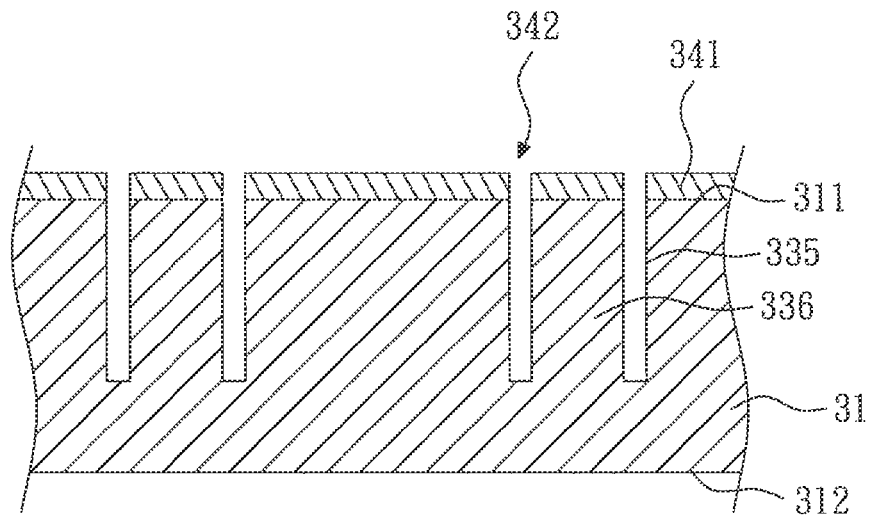

In the embodiment, a first photo resist layer 341 is formed on the first surface 311 of the substrate 31, a first pattern 342 is formed on the first photo resist layer 341, and the first pattern 342 is an annular opening, as shown in FIGS. 22 and 23. Referring to FIG. 24, the annular groove 335 and the pillar 336 are formed on the substrate 31 by etching according to the first pattern 342. The annular groove 335 surrounds the pillar 336, and the annular groove 335 does not penetrate the substrate 31. The first photo resist layer 341 is then removed.

Referring to FIGS. 25 to 29, a first insulating material 321 is formed in the annular groove 335. In the embodiment, the first insulating material 321 is polymer 361. In the present invention, the method for forming the first insulating material 321 in the annular groove 335 includes but is not limited to the following three methods.

Figure 25:
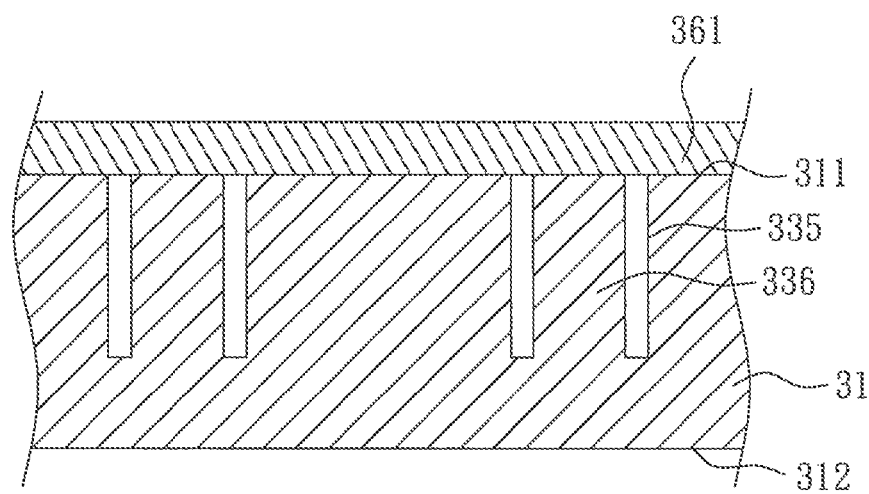
Figure 26:
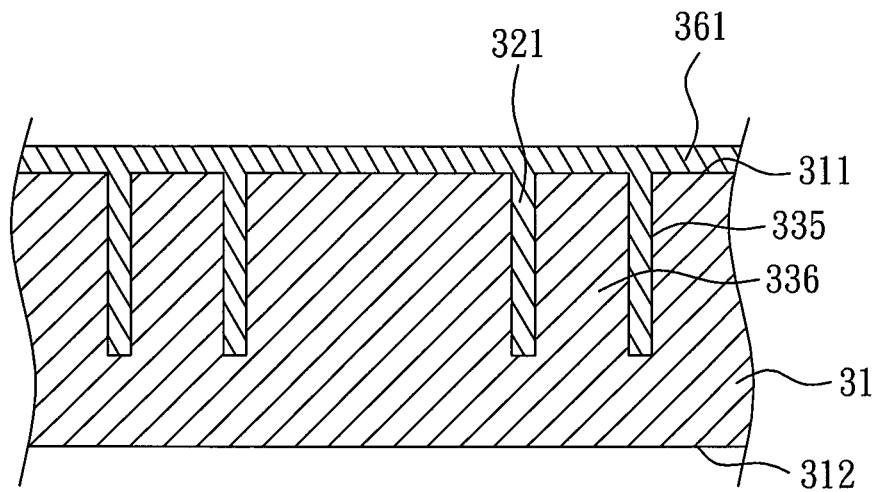

The first method is that the polymer 361 is dispersed on the first surface 311 of the substrate 31, and the position of the polymer 361 corresponds to the annular groove 335, as shown in FIG. 25. Alternatively, the polymer 361 can be partially dispersed at a position corresponding to the annular groove 335. Afterward, the polymer 361 is impelled into the annular groove 335 by vacuuming so as to form the first insulating material 321, as shown in FIG. 26. Finally, part of the polymer 361 which is outside the annular groove 335 is removed.

Figure 27:
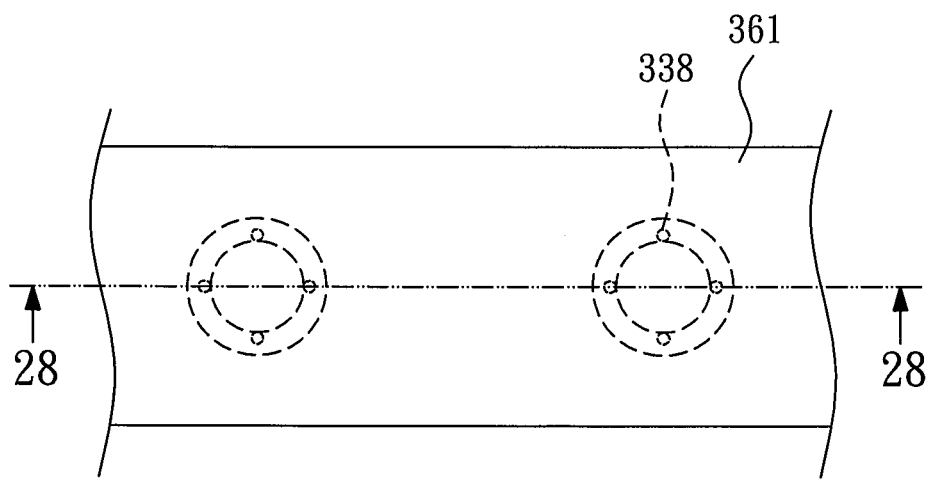
Figure 28:
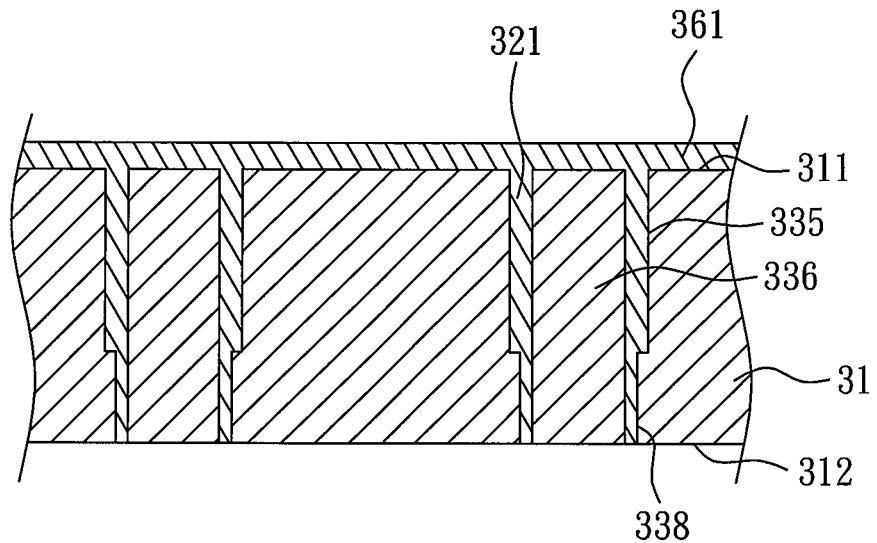

The second method is that a plurality of second vents 338 are formed to connect the annular groove 335 to the second surface 312 of the substrate 31, as shown in FIG. 27, a top view of the substrate 31, and FIG. 28, a cross-sectional view along line 28-28 in FIG. 27. Afterward, the polymer 361 is dispersed on the first surface 311 of the substrate 31, and the position of the polymer 361 corresponds to the annular groove 335. Alternatively, the polymer 361 can be partially dispersed at a position corresponding to the annular groove 335. The annular groove 335 and the second vents 338 are then filled with the polymer 361 so as to form the first insulating material 321. Finally, part of the polymer 361 which is outside the annular groove 335 and the second vents 338 is removed.

Figure 29:
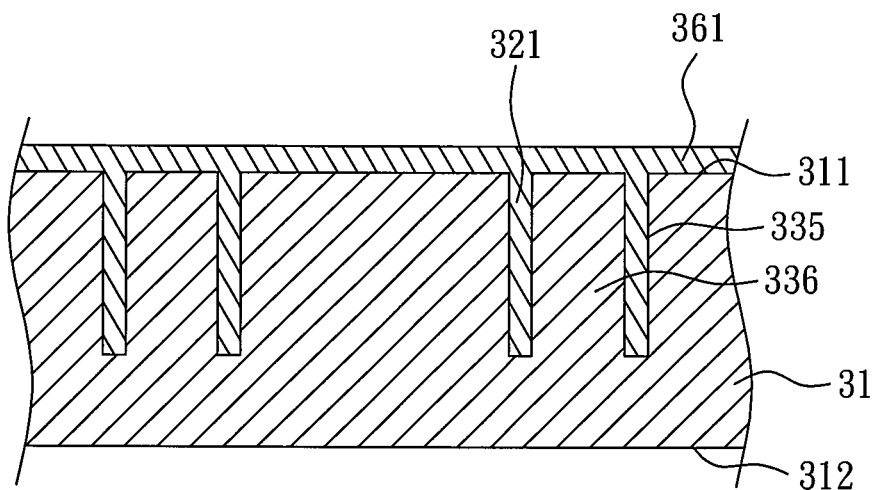
Figure 30:
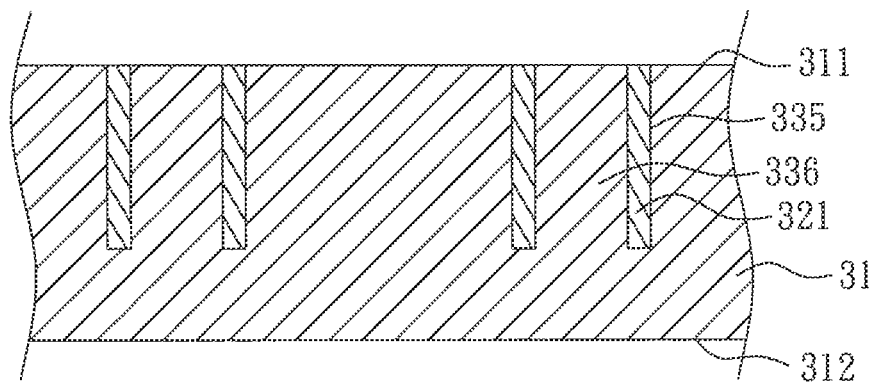

The third method is that the polymer 361 is atomized and deposited in the annular groove 335 by spray coating so as to form the first insulating material 321, as shown in FIG. 29. Referring to FIG. 30, part of the polymer 361 which is outside the annular groove 335 is removed.

Figure 31:
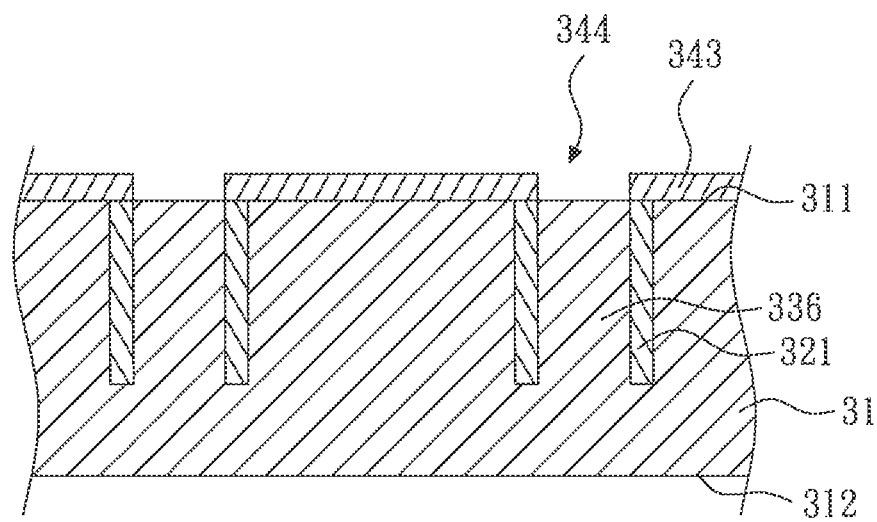
Figure 32:
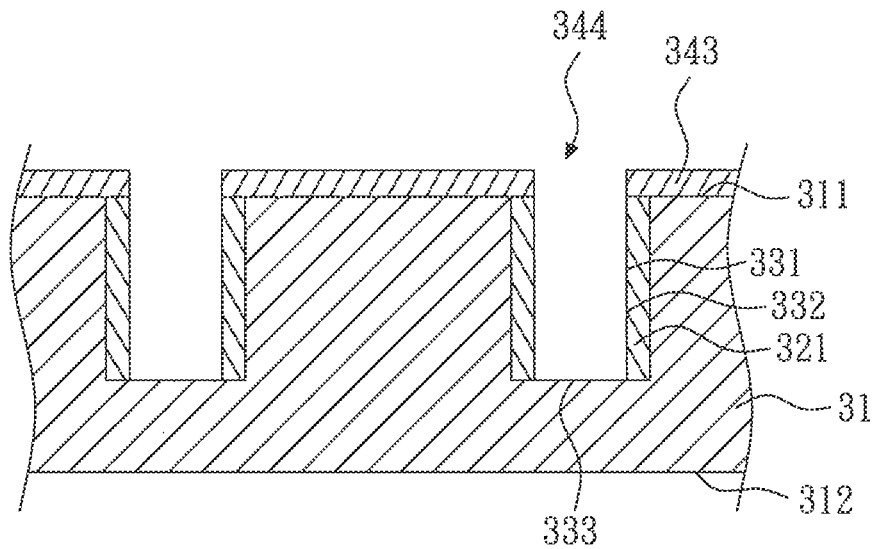

Referring to FIGS. 31 and 32, the pillar 336 of the substrate 31 is removed so as to form a groove 331 on the substrate 31. The groove 331 has a side wall 332 and a bottom wall 333. In the embodiment, referring to FIG. 31, a second photo resist layer 343 is formed on the first surface 311 of the substrate 31. A second opening 344 is formed on the second photo resist layer 343, and the position of the second opening 344 corresponds to the pillar 336. Afterward, the pillar 336 is removed by dry etching or wet etching according to the second opening 344, so as to form the groove 331. The groove 331 has the side wall 332 and the bottom wall 333. The second photo resist layer 343 is then removed immediately or in a subsequent step.

Figure 33:
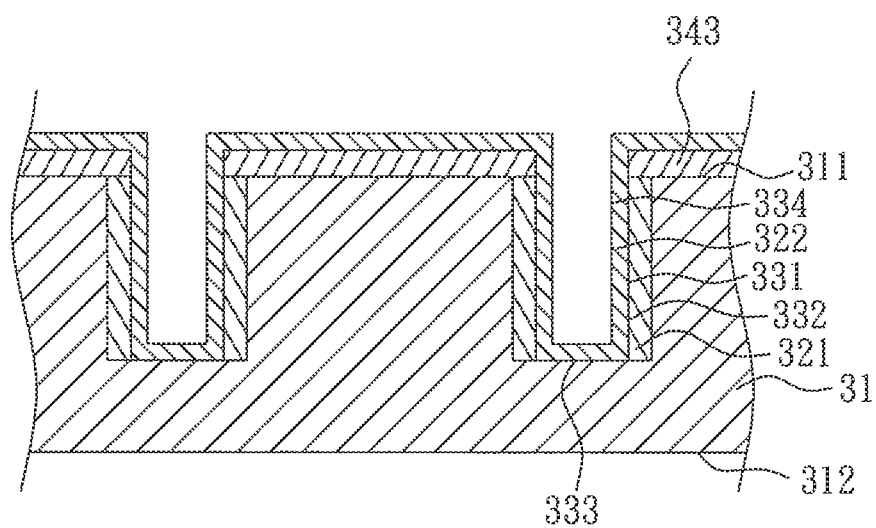

Referring to FIG. 33, a conductive metal 322 is formed on the side wall 332 and the bottom wall 333 of the groove 331 by electroplating, so as to form a central groove 334. In the embodiment, the material of the first conductive metal 322 is copper. Part of the first conductive metal 322 which is outside the groove 331 is then removed immediately or in a subsequent step.

Afterward, referring to FIGS. 34 to 38, a center insulating material 323 is formed in the central groove 334. In the embodiment, the center insulating material 323 is a polymer 363. In the present invention, the method for forming the center insulating material 323 in the central groove 334 includes but is not limited to the following three methods.

Figure 34:
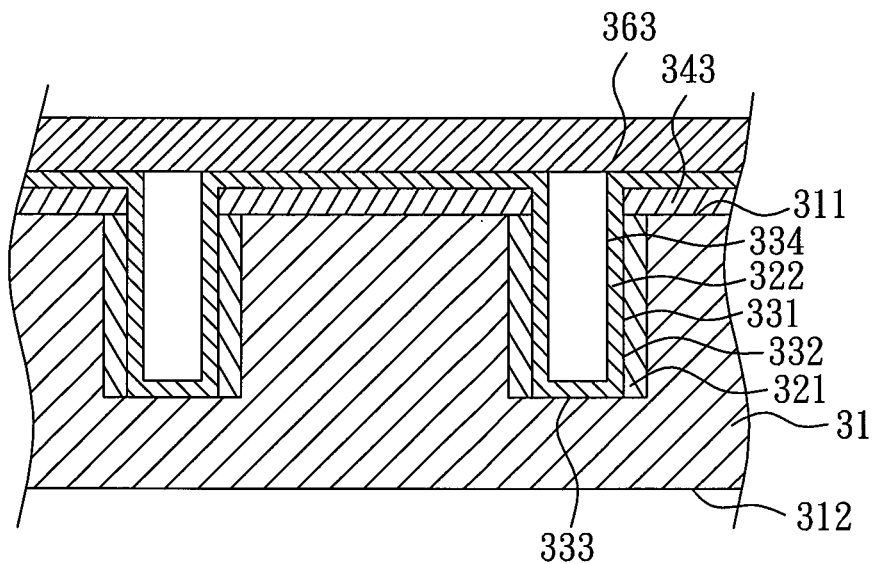
Figure 35:
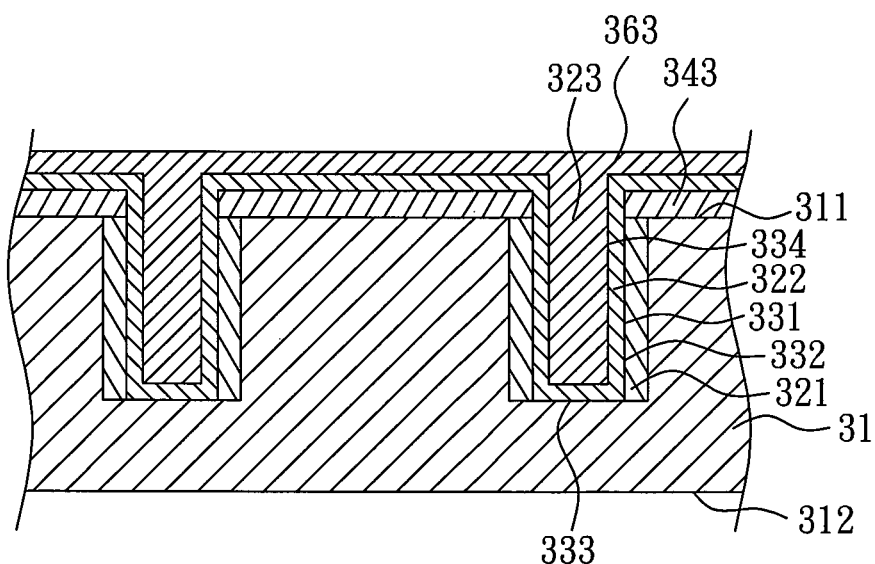

The first method is that the polymer 363 is dispersed on the first surface 311 of the substrate 31, and the position of the polymer 363 corresponds to the central groove 334, as shown in FIG. 34. Alternatively, the polymer 363 can be partially dispersed at a position corresponding to the central groove 334. Afterward, the polymer 363 is impelled into the central groove 334 by vacuuming so as to form the center insulating material 323, as shown in FIG. 35.

Figure 36:
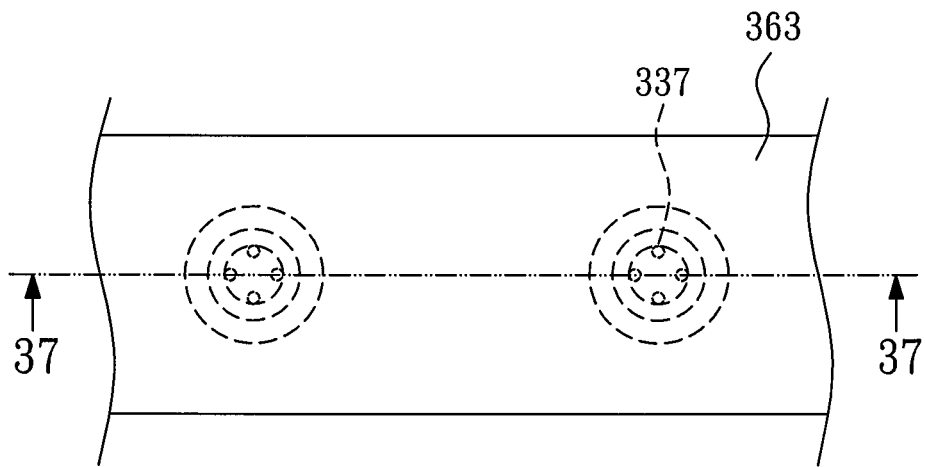
Figure 37:
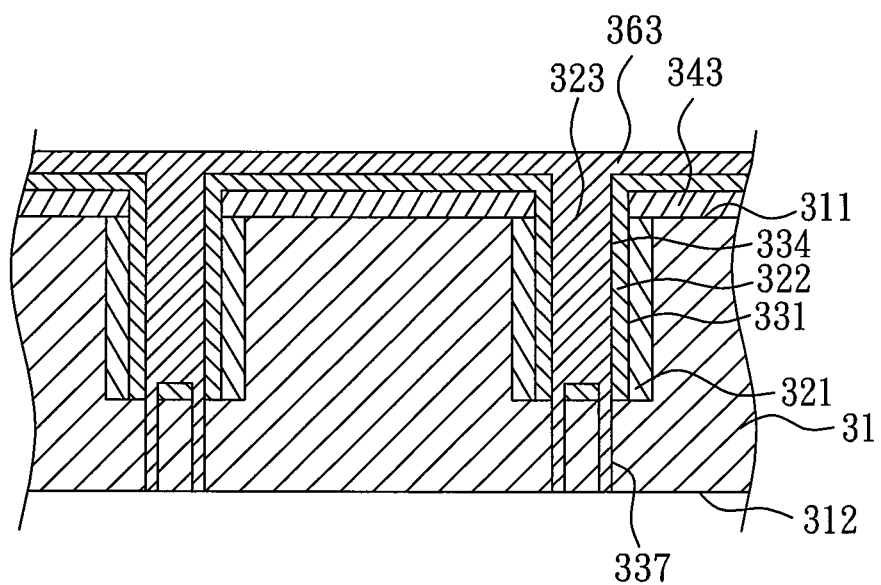

The second method is that a plurality of first vents 337 are formed to connect the central groove 334 to the second surface 312 of the substrate 31, as shown in FIG. 36, a top view of the substrate 31, and FIG. 37, a cross-sectional view along line 37-37 in FIG. 36. Afterward, the polymer 363 is dispersed on the first surface 311 of the substrate 31, and the position of the polymer 363 corresponds to the central groove 334. Alternatively, the polymer 363 can be partially dispersed at a position corresponding to the central groove 334. The central groove 334 and the first vents 337 are then filled with the polymer 363 so as to form the center insulating material 323.

Figure 38:
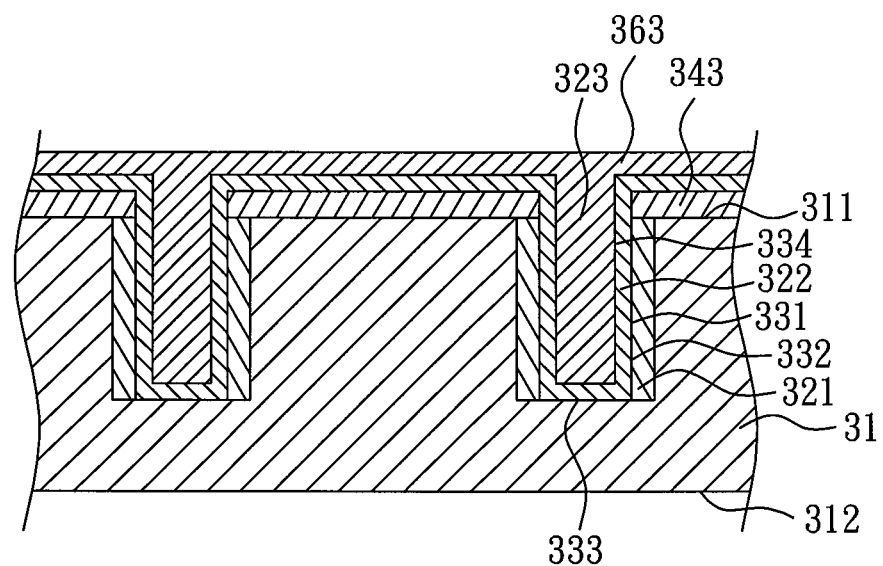

The third method is that the polymer 363 is atomized and deposited in the central groove 334 by spray coating so as to form the center insulating material 323, as shown in FIG. 38.

Figure 39:
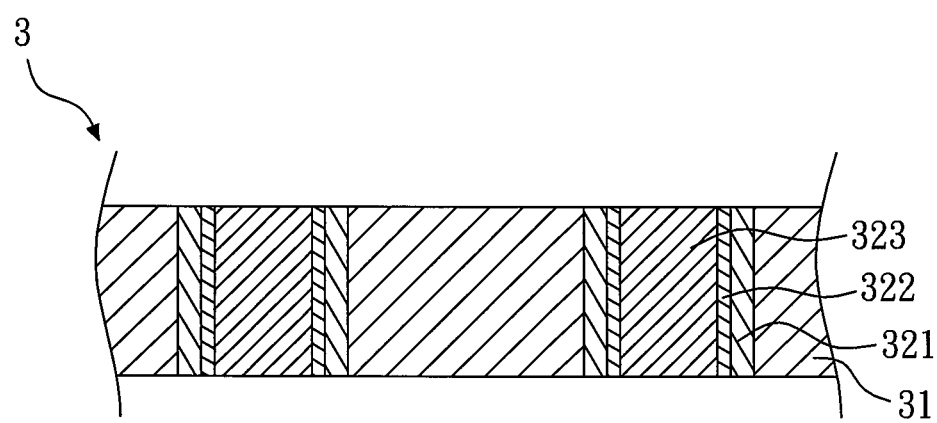

Afterward, referring to FIG. 39, part of the first surface 311 and part of the second surface 312 of the substrate 31 are removed by etching or grinding so as to expose the first conductive metal 322, the center insulating material 323 and the first insulating material 321. A substrate 3 with a via according to the second embodiment of the present invention is formed.

Figure 40:
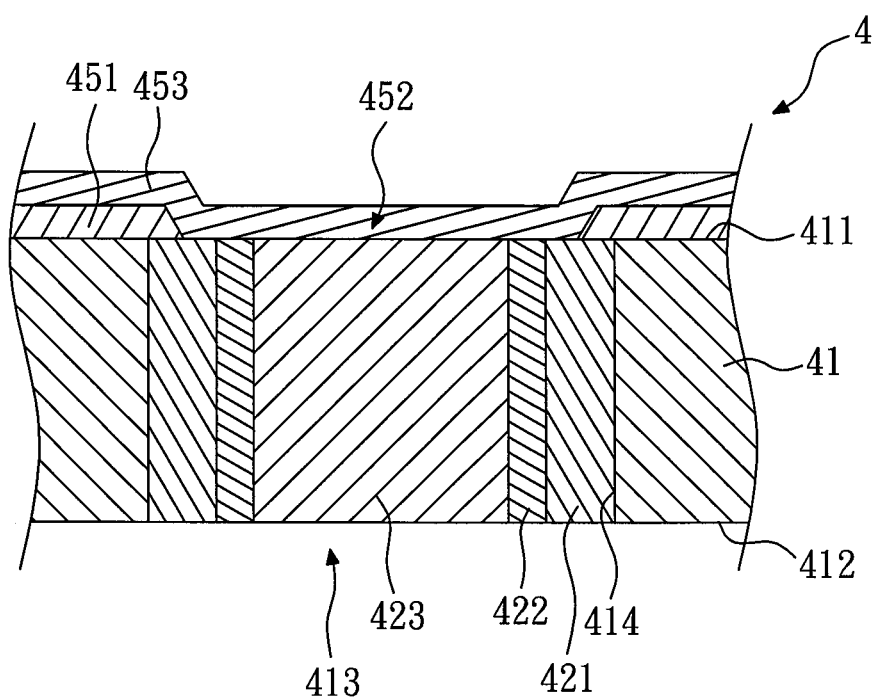
FIG. 40 is a schematic view of a substrate with a via according to a third embodiment of the present invention.

FIG. 40 shows a schematic view of a substrate with a via according to a third embodiment of the present invention. The substrate 4 with a via comprises a substrate 41, a first insulating material 421, a center insulating material 423 and a first conductive metal 422.

The substrate 41 has a first surface 411, a second surface 412 and a via 413. The via 413 penetrates the substrate 41, and has an inner side wall 414. The first insulating material 421 is a hollow pillar disposed on the inner side wall 414 of the via 413. The center insulating material 423 is a solid pillar, disposed at the center of the via 413, and spaced from the first insulating material 421. The first conductive metal 422 is disposed between the first insulating material 421 and the center insulating material 423, and surrounds the center insulating material 423 so as to form a hollow pillar. In the embodiment, the first insulating material 421 contacts the first conductive metal 422, and the center insulating material 423 contacts the first conductive metal 422. That is, a three-layered structure with insulating material and conductive material in alternate layers is formed in the via 413, and the structure includes the center insulating material 423, the first conductive metal 422 and the first insulating material 421 from the center to the edge. The center insulating material 423 and the first insulating material 421 may be the same or different.

The substrate 4 with a via further comprises a passivation layer 451 and a conducting layer 453. The passivation layer 451 is disposed on the first surface 411 or the second surface 412 of the substrate 41. In the embodiment, the passivation layer 451 is disposed on the first surface 411 of the substrate 41. The passivation layer 451 has an opening 452, so that the passivation layer 451 covers part of the first insulating material 421 and exposes part of the first insulating material 421. The conducting layer 453 is disposed on the passivation layer 451, and covers part of the first insulating material 421, the first conductive metal 422 and the center insulating material 423.

Figure 41:
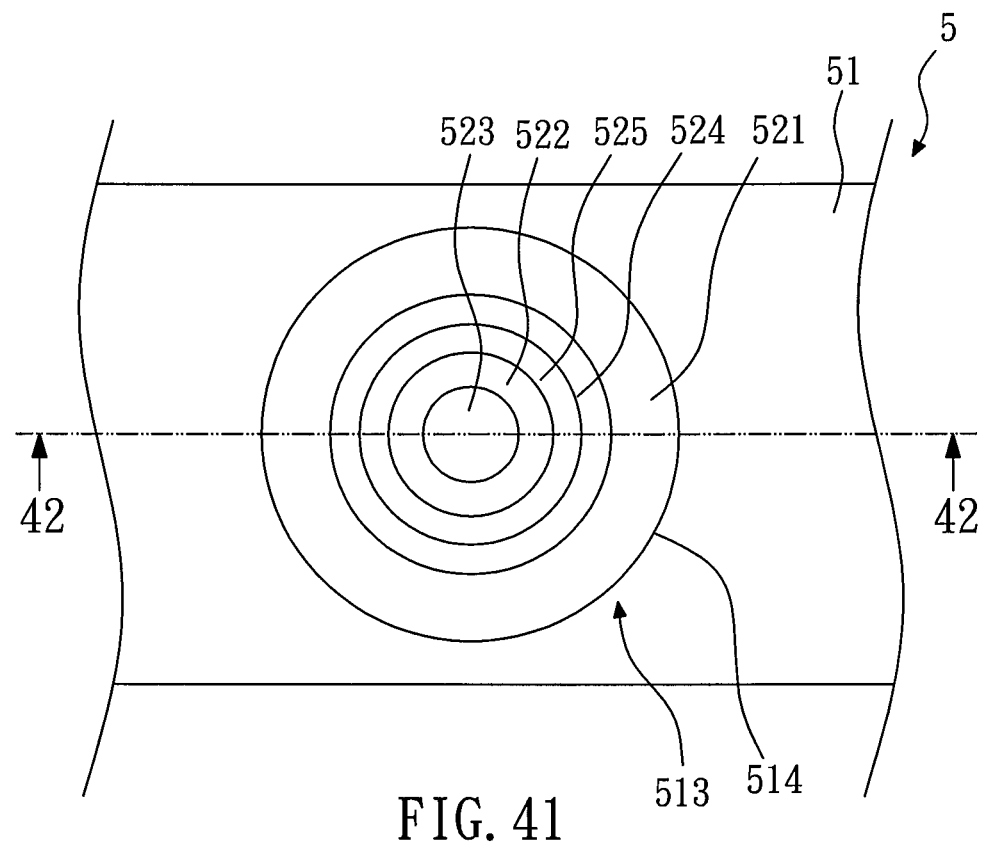
FIGS. 41 and 42 are schematic views of a substrate with a via according to a fourth embodiment of the present invention.
Figure 42:
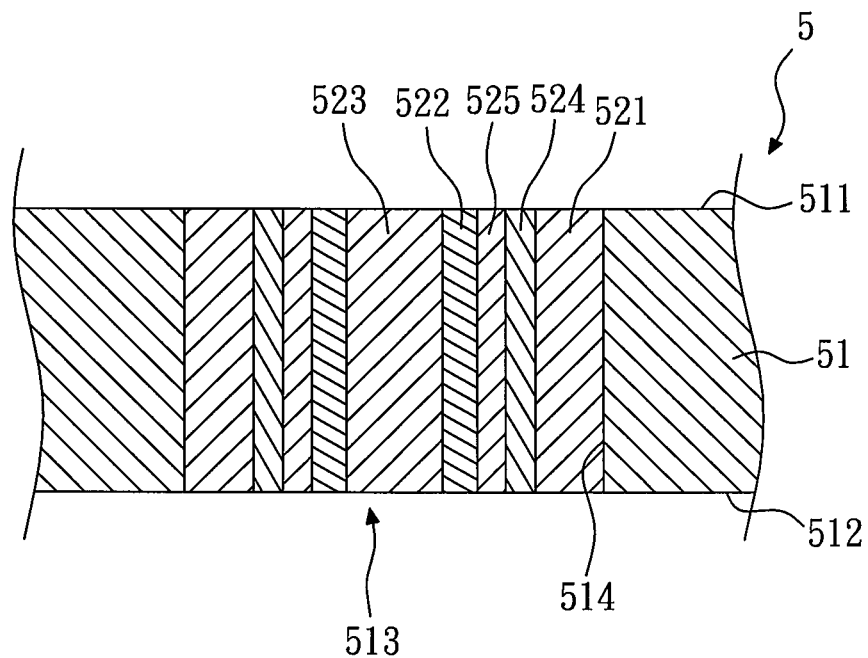

FIGS. 41 and 42 show schematic views of a substrate with a via according to a fourth embodiment of the present invention. FIG. 41 is a top view of the substrate, and FIG. 42 is a cross-sectional view along line 42-42 in FIG. 41. The substrate 5 with a via comprises a substrate 51, a first insulating material 521, a center insulating material 523, a first conductive metal 522, a second insulating material 525 and a second conductive metal 524.

The substrate 51 has a first surface 511, a second surface 512 and a via 513. The via 513 penetrates the substrate 51, and has an inner side wall 514. The first insulating material 521 is a hollow pillar disposed on the inner side wall 514 of the via 513. The center insulating material 523 is a solid pillar, disposed at the center of the via 513, and spaced from the first insulating material 521. The first conductive metal 522 is disposed between the center insulating material 523 and the second insulating material 525, and surrounds the center insulating material 523 so as to form a hollow pillar. The second insulating material 525 is disposed between the first conductive metal 522 and the second conductive metal 524, and surrounds the first conductive metal 522 so as to form a hollow pillar. The second conductive metal 524 is disposed between the second insulating material 515 and the first insulating material 521, and surrounds the second insulating material 525 so as to form a hollow pillar. In the embodiment, the second insulating material 525 contacts the first conductive metal 522, the second conductive metal 524 contacts the second insulating material 525, and the second conductive metal 524 contacts the first insulating material 521. That is, a five-layered structure with insulating material and conductive material in alternate layers is formed in the via 513, and the structure includes the center insulating material 523, the first conductive metal 522, the second insulating material 525, the second conductive metal 524 and the first insulating material 521 from the center to the edge. The center insulating material 523, the first insulating material 521 and the second insulating material 525 may be the same or different. The material of the first conductive metal 522 and the second conductive metal 524 may be the same or different.

Moreover, it is understood that, in the substrate 5 with a via, more layers of insulating material and conductive metal can be placed between the center insulating material 523 and the first insulating material 521, so as to form a multi-layered structure with insulating material and conductive material in alternate layers.

Figure 43:
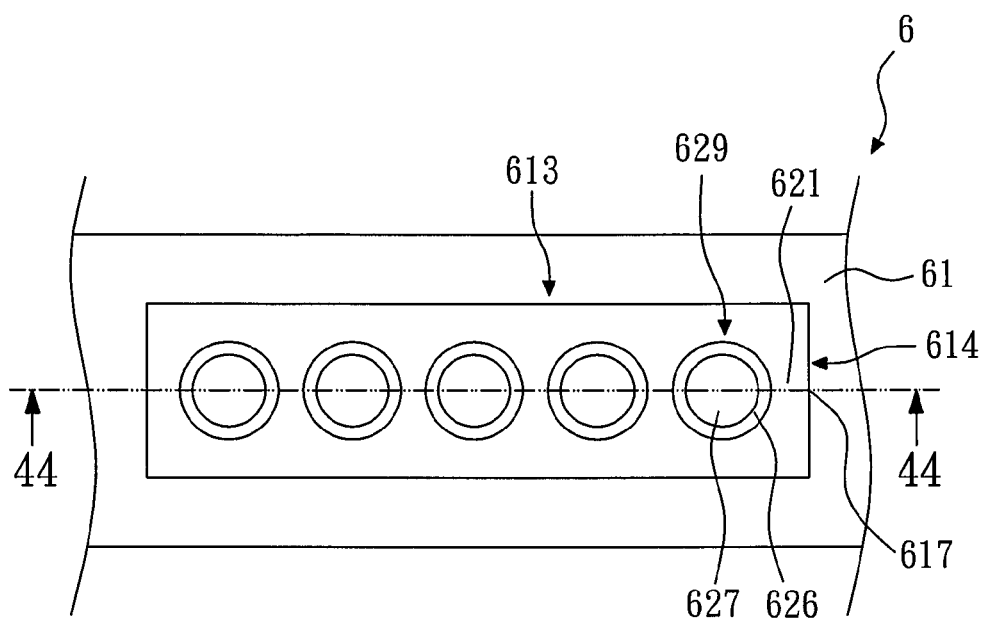
FIGS. 43 and 44 are schematic views of a substrate with a via according to a fifth embodiment of the present invention.
Figure 44:
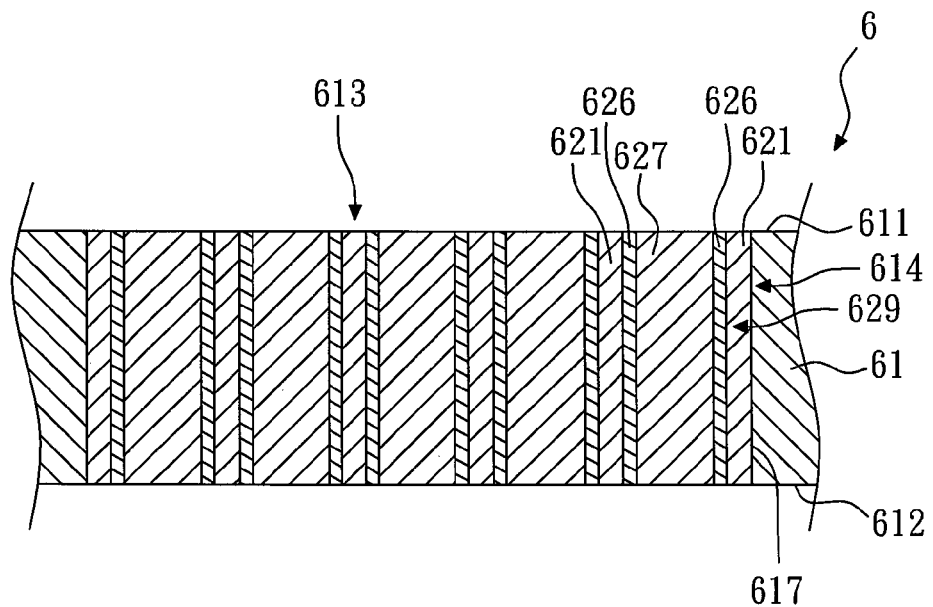

FIGS. 43 and 44 show schematic views of a substrate with a via according to a fifth embodiment of the present invention. FIG. 43 is a top view of the substrate, and FIG. 44 is a cross-sectional view along line 44-44 in FIG. 43. The substrate 6 with a via comprises a substrate 61, a first insulating material 621 and a plurality of grooves 629.

The substrate 61 has a first surface 611, a second surface 612 and a via 613. The via 613 penetrates the substrate 61, and has an accommodating groove 614. The accommodating groove 614 has a side wall 617. The first insulating material 621 is disposed in the via 613, and attached to the side wall 617 of the via 613. The grooves 629 are disposed in the first insulating material 621. Each of the grooves 629 penetrates the first insulating material 621, and comprises a center insulating material 627 and a first conductive metal 626. The center insulating material 627 is a solid pillar, and disposed at the center of the grooves 629. The first conductive metal 626 surrounds and contacts the center insulating material 627, and contacts the first insulating material 621. The first insulating material 621 and the center insulating material 627 may be the same or different.

Moreover, it is understood that, in the substrate 6 with a via, more layers of insulating material and conductive metal may be placed between the center insulating material 627 and the first conductive metal 626 of each of the grooves 629, or between the first conductive metal 626 and the first insulating material 621 of each of the grooves 629, so as to form a multi-layered structure with insulating material and conductive material in alternate layers.

The substrate 6 with a via further comprises a passivation layer (not shown) and a conducting layer (not shown). The passivation layer is disposed on the first surface 611 or the second surface 612 of the substrate 61, and has a plurality of openings. The position of each of the openings of the passivation layer corresponds to each of the grooves 629, and the diameter of each of the openings of the passivation layer is larger than that of each of the grooves 629, so that the passivation layer covers part of the first insulating material 621 and exposes part of the first insulating material 621. The conducting layer is disposed on the passivation layer, and covers part of the first insulating material 621, the first conductive metal 626 and the center insulating material 627.

Figure 45:
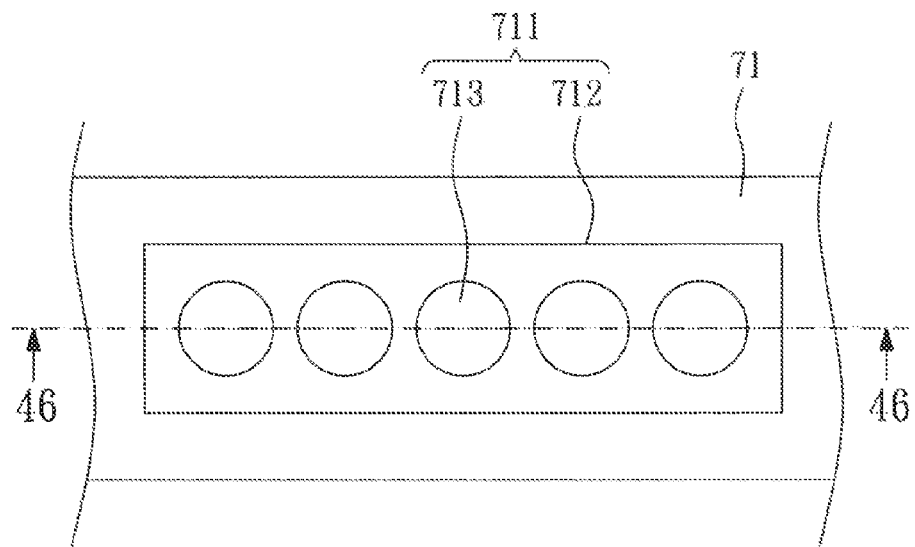
FIGS. 45 to 67 show schematic views of a method for forming a via in a substrate according to the fifth embodiment of the present invention.
Figure 67:
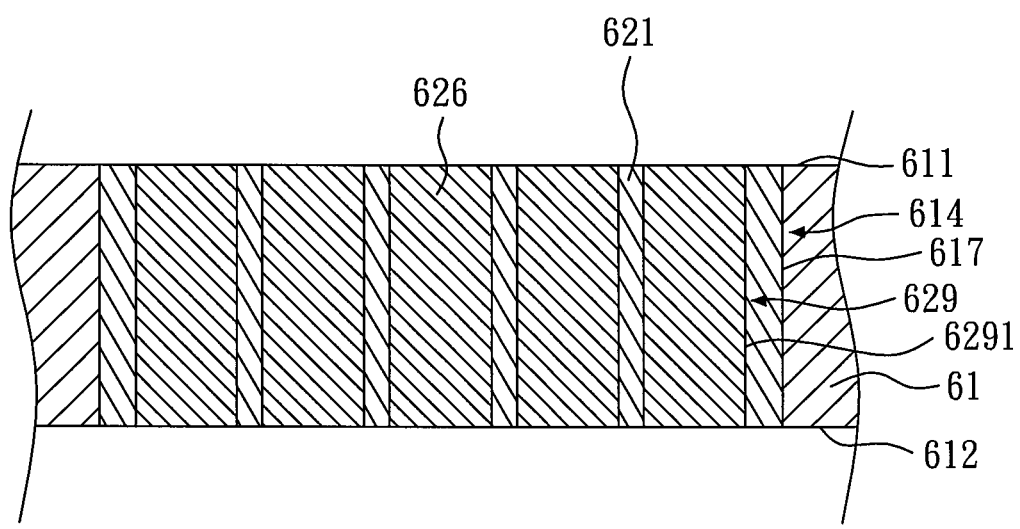

FIGS. 45 and 67 show schematic views of a method for forming a via in a substrate according to the fifth embodiment of the present invention. Referring to FIG. 45, a top view of the substrate, and FIG. 46, a cross-sectional view along line 46-46 in FIG. 45, first, a substrate 61 is provided. The substrate 61 has a first surface 611 and a second surface 612. The substrate 61 is, for example, a wafer or a silicon substrate. Afterward, referring to FIGS. 51 and 52, an accommodating groove 614 and a plurality of pillars 636 are formed on the first surface 611 of the substrate 61.

Figure 46:
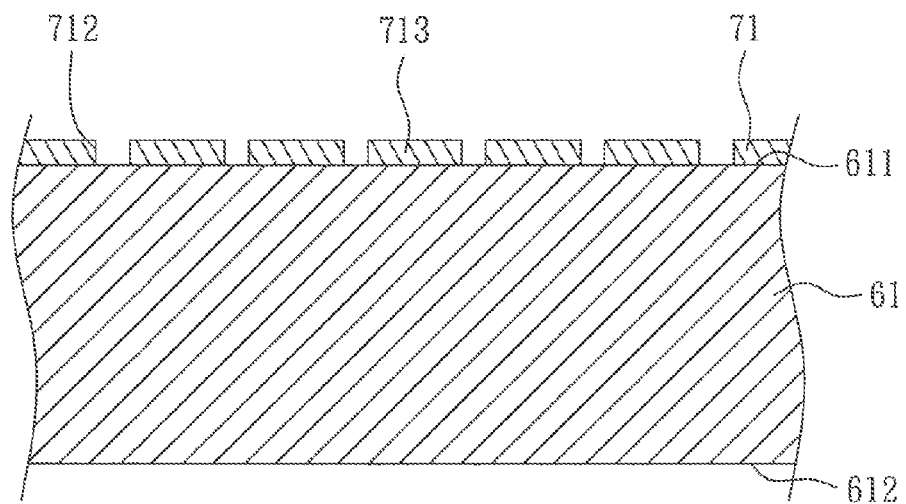

In the embodiment, as shown in FIGS. 45 and 46, a first photo resist layer 71 is formed on the first surface 611 of the substrate 61. Then, a first pattern 711 is formed on the first photo resist layer 71. The first pattern 711 comprises a first opening 712 and a plurality of inner areas 713. The inner areas 713 are located within the first opening 712 and spaced apart from each other. That is, the inner areas 713 do not contact each other and the side wall of the first opening 712.

Figure 47:
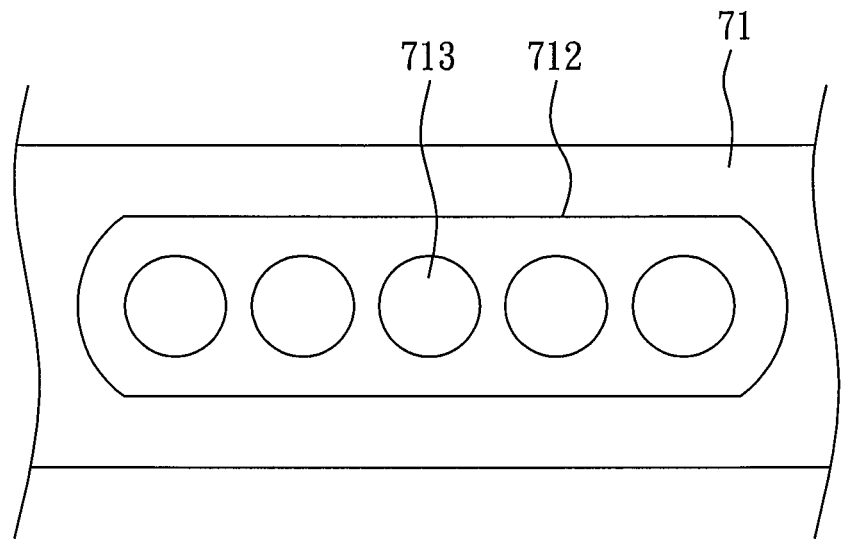
Figure 48:
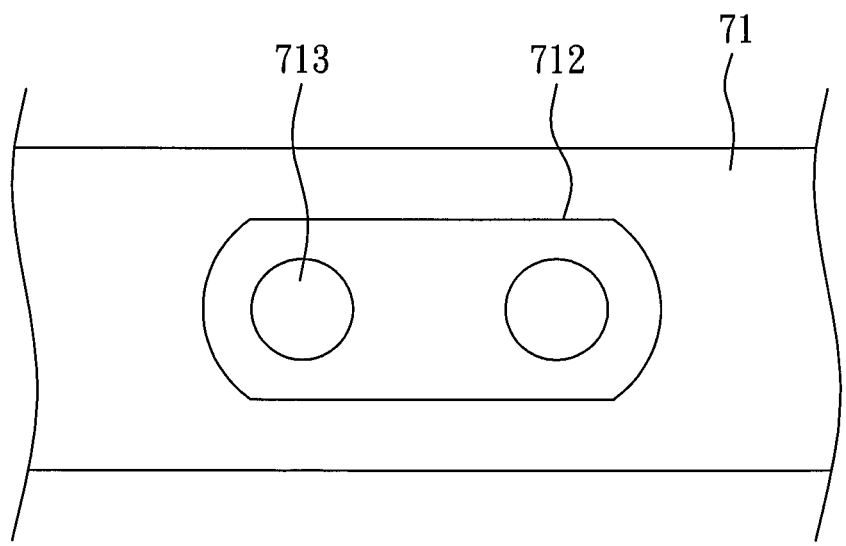
Figure 49:
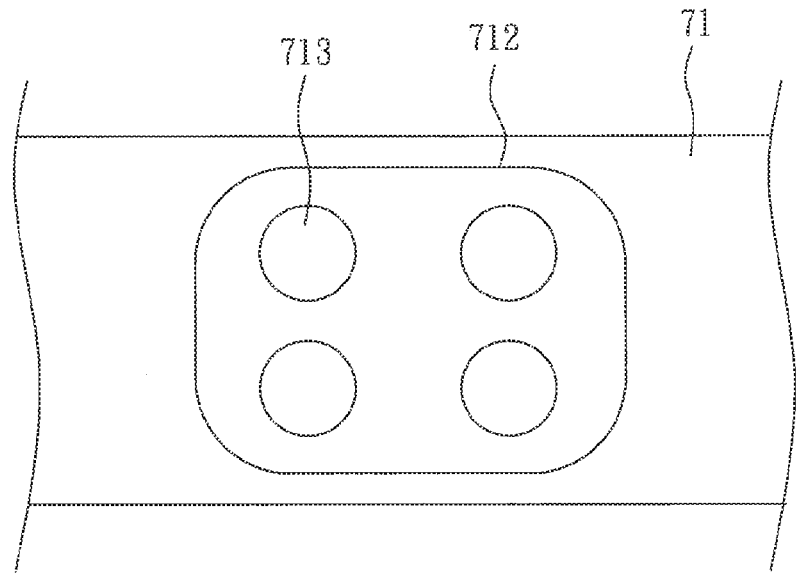

In the embodiment, the first opening 712 is rectangular and the inner areas 713 are circular from top view, and there are five inner areas 713 in a first opening 712. However, in other embodiments, two sides of the first opening 712 are curved from top view, as shown in FIG. 47; there are two inner areas 713 in a first opening 712, as shown in FIG. 48; there are four inner areas 713 arranged in a array in a first opening 712, as shown in FIG. 49.

Figure 50:
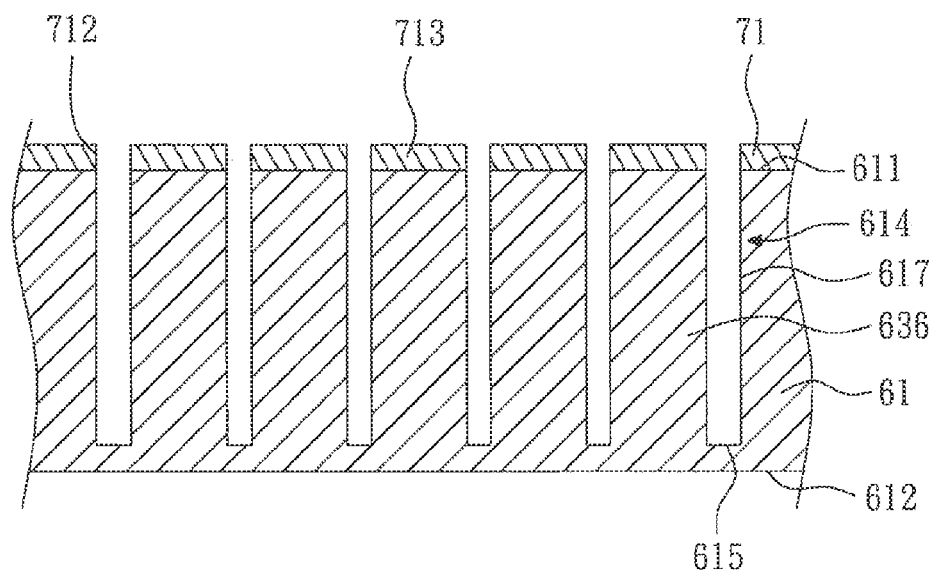

Referring to FIG. 50, the accommodating groove 614 and the pillars 636 are formed by etching the substrate 61 according to the first pattern 711. Therefore, the accommodating groove 614 and the pillars 636 are formed at the same time. The accommodating groove 614 corresponds to the first opening 712, and the pillars 636 correspond to the inner areas 713. Then, the first photo resist layer 71 is removed.

Figure 51:
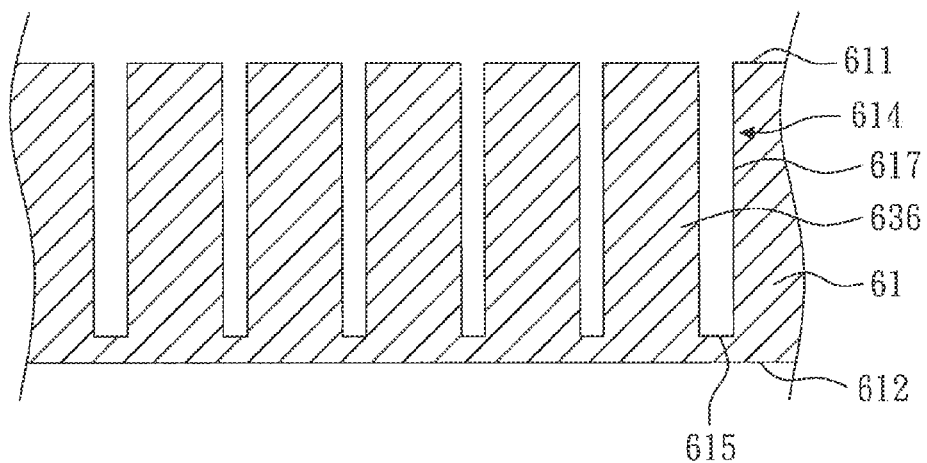
Figure 52:
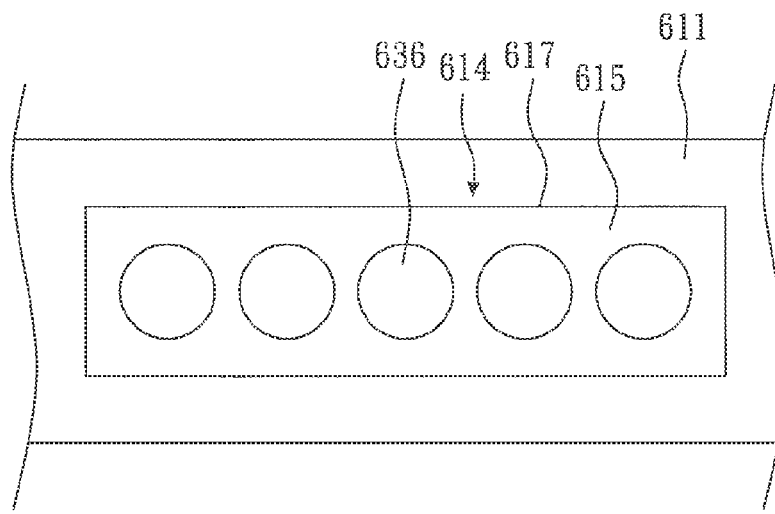

Referring to FIGS. 51 and 52, wherein FIG. 52 is a top view of FIG. 51. The accommodating groove 614 has a side wall 617 and a bottom wall 615, the pillars 636 remain on the bottom wall 615 of the accommodating groove 614. That is, the pillars 636 protrude from the bottom wall 615 of the accommodating groove 614, and there is a completely empty space between the pillars 636. In the embodiment, the accommodating groove 614 is rectangular from top view, and the pillars 636 are solid cylinders. The accommodating groove 614 does not penetrate the substrate 61. Each of the pillars 636 is a part of the substrate 61, and the top surfaces of the pillars 636 are coplanar with the first surface 611 of the substrate 61. However, the accommodating groove 614 and the pillars 636 may be in other appearance, which depends on the design of the first pattern 711.

Figure 53:
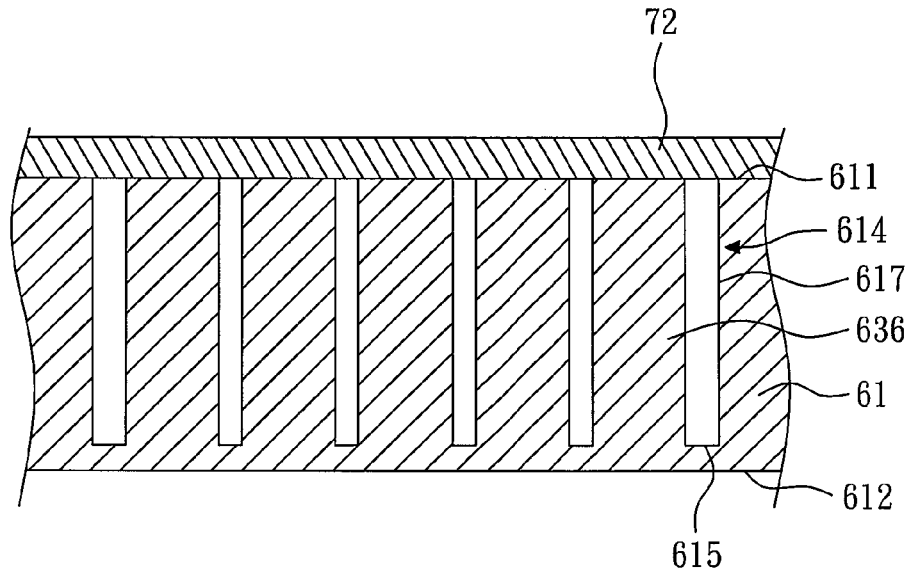
Figure 54:
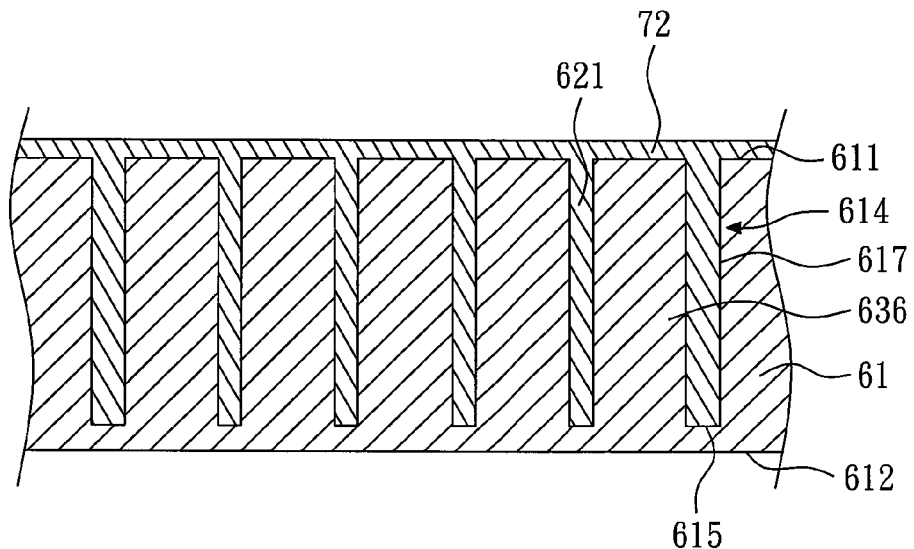

Referring to FIGS. 53 to 54, a first insulating material 621 is formed in the accommodating groove 614 and between the pillars 636. In the embodiment, the first insulating material 621 is polymer 72, and the method for forming the first insulating material 621 includes but is not limited to the following methods.

The first method is that the polymer 72 is dispersed on the first surface 611 of the substrate 61, and the position of the polymer 72 corresponds to the accommodating groove 614, as shown in FIG. 53. Alternatively, the polymer 72 can be partially dispersed at a position corresponding to the accommodating groove 614. Afterward, the polymer 72 is impelled into the accommodating groove 614 by vacuuming so as to form the first insulating material 621, as shown in FIG. 54. Finally, part of the polymer 72 which is outside the accommodating groove 614 is removed.

Figure 55:
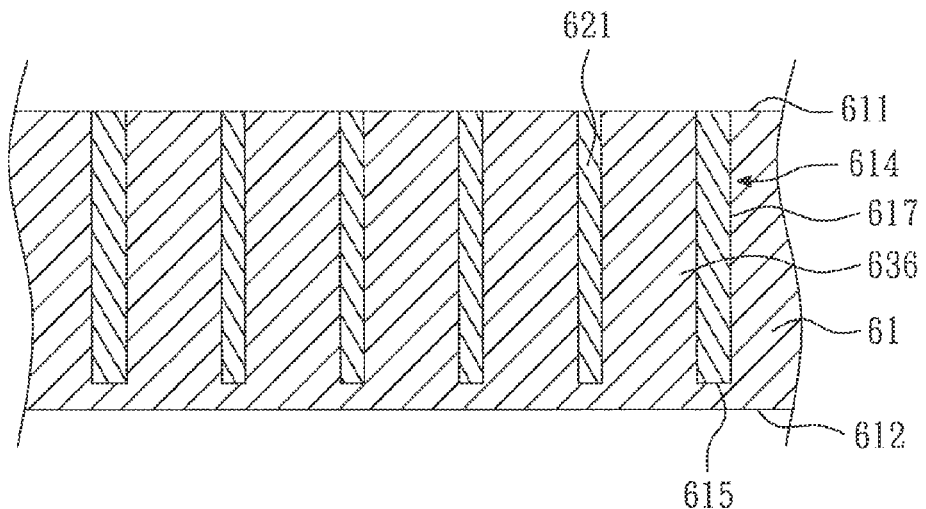

The second method is that the polymer 72 is atomized and deposited in the accommodating groove 614 by spray coating so as to form the first insulating material 621, as shown in FIG. 54. Referring to FIG. 55, part of the polymer 72 which is outside the accommodating groove 614 is removed.

Figure 56:
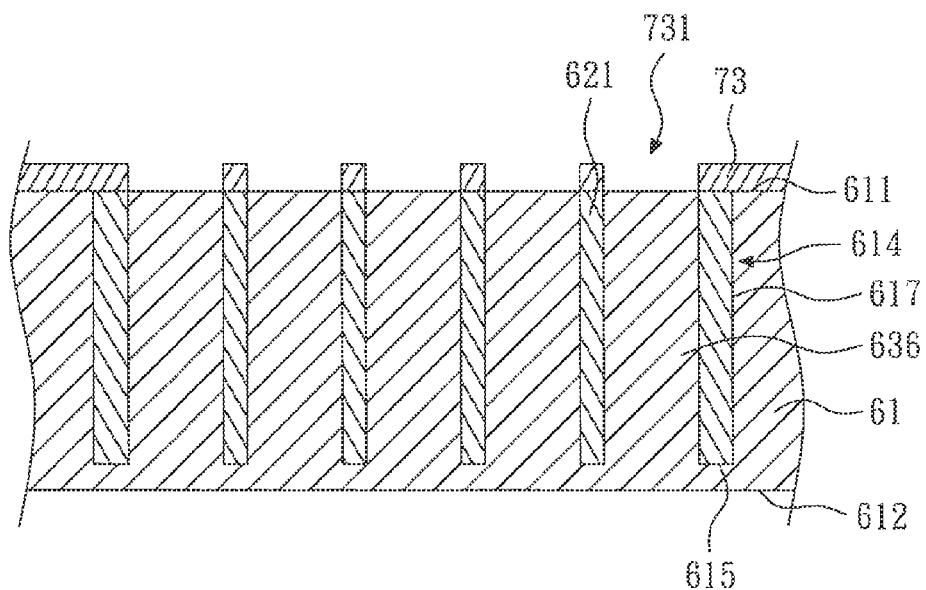
Figure 57:
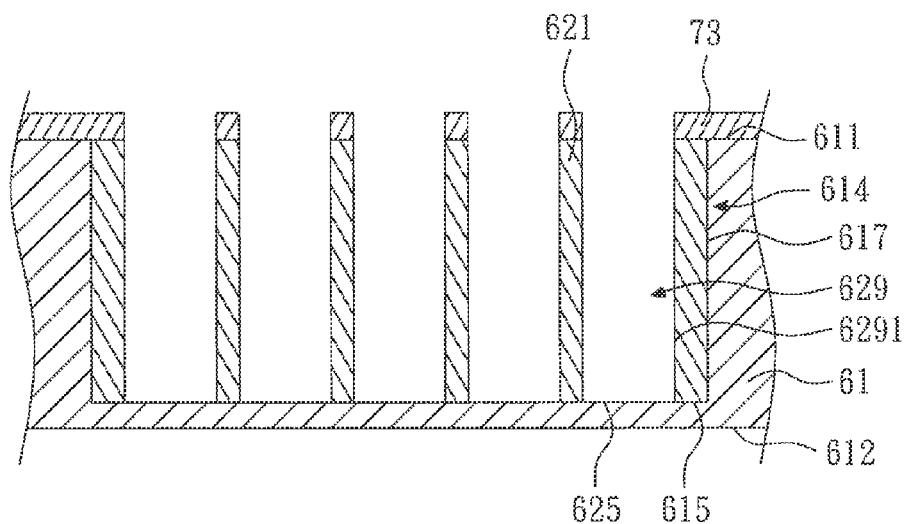

Referring to FIGS. 56 and 57, all of the pillars 636 of the substrate 61 are removed completely so as to form a groove 629 in the first insulating material 621. In the embodiment, referring to FIG. 56, a second photo resist layer 73 is formed on the first surface 611 of the substrate 61. A plurality of second openings 731 are formed on the second photo resist layer 73, and the positions of the second openings 731 correspond to the pillars 636. Preferably, the sizes of the second openings 731 are equal to those of the pillars 636 so as to expose the top surfaces of the pillars 636. Afterward, referring to FIG. 57, all of the pillars 636 are removed completely by dry etching or wet etching according to the second opening 731, so as to form the grooves 629. The second photo resist layer 73 is then removed immediately or in a subsequent step. In the embodiment, the grooves 629 comprise side surfaces 6291 and bottom surfaces 625. Bottom surfaces 625 of the grooves 629 and the bottom wall 615 of the accommodating groove 614 are substantially coplanar. However, in other embodiments, the bottom surfaces 625 of the grooves 629 may be higher or lower than the bottom wall 615 of the accommodating groove 614.

Figure 58:
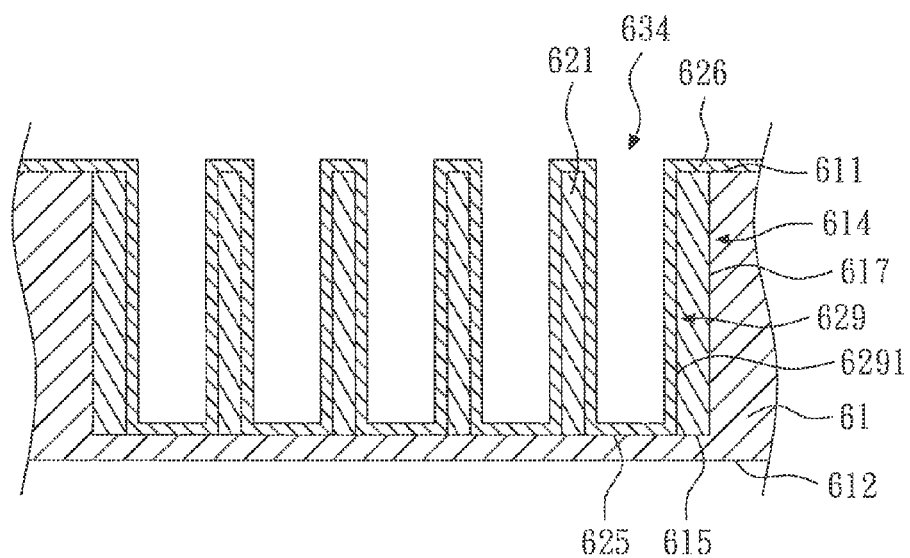

Referring to FIG. 58, a first conductive metal 626 is formed in the grooves 629. In the embodiment, the material of the first conductive metal 626 is copper and is formed by electroplating. The first conductive metal 626 does not fill the grooves 629, which forms a plurality of central grooves 634. That is, the first conductive metal 626 is formed on the side surfaces 6291 and the bottom surfaces 625 of the grooves 629 so as to form the central grooves 634. Part of the first conductive metal 626 which is dispersed on the first surface 611 is then removed immediately or in a subsequent step.

Afterward, referring to FIGS. 59 to 63, a center insulating material 627 is formed in the central grooves 634. In the embodiment, the center insulating material 627 is a polymer 74. In the present invention, the method for forming the center insulating material 627 in the central grooves 634 includes but is not limited to the following three methods.

Figure 59:
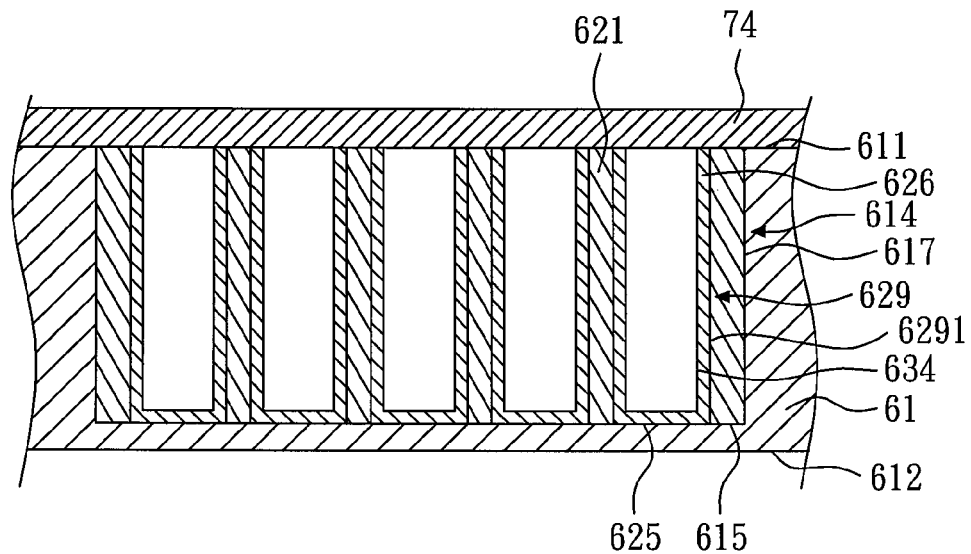
Figure 60:
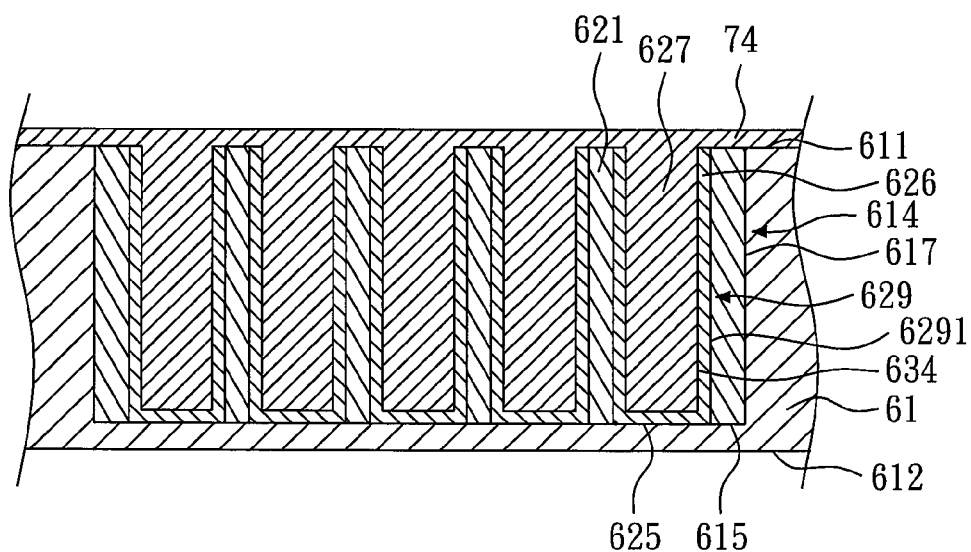

The first method is that the polymer 74 is dispersed on the first surface 611 of the substrate 61, and the position of the polymer 74 corresponds to the central grooves 634, as shown in FIG. 59. Alternatively, the polymer 74 can be partially dispersed at a position corresponding to the central grooves 634. Afterward, the polymer 74 is impelled into the central grooves 634 by vacuuming so as to form the center insulating material 627, as shown in FIG. 60.

Figure 61:
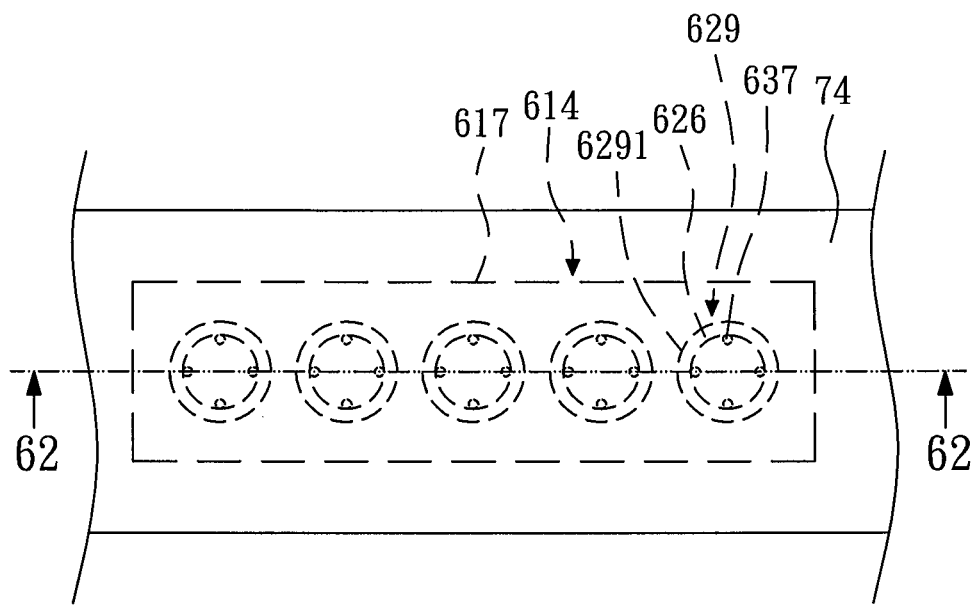
Figure 62:
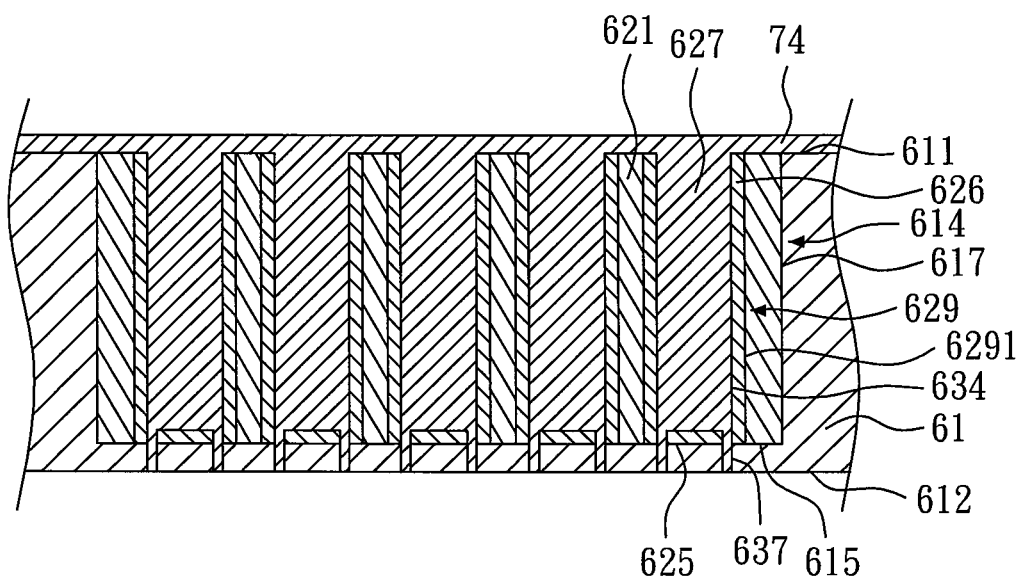

The second method is that a plurality of first vents 637 are formed to connect the central grooves 634 to the second surface 612 of the substrate 61, as shown in FIGS. 61 and 62, wherein FIG. 62 is a cross-sectional view along line 62-62 in FIG. 61. Afterward, the polymer 74 is dispersed on the first surface 611 of the substrate 61, and the position of the polymer 74 corresponds to the central grooves 634. Alternatively, the polymer 74 can be partially dispersed at a position corresponding to the central grooves 634. The central grooves 634 and the first vents 637 are then filled with the polymer 74 so as to form the center insulating material 627.

Figure 63:
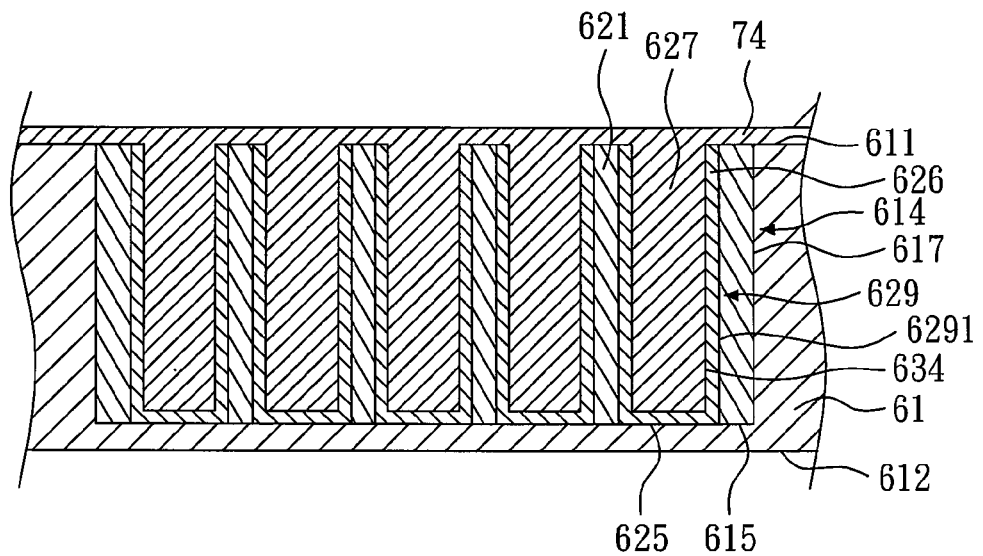

The third method is that the polymer 74 is atomized and deposited in the central grooves 634 by spray coating so as to form the center insulating material 627, as shown in FIG. 63.

Afterward, referring to FIG. 44, part of the first surface 611 and part of the second surface 612 of the substrate 61 are removed by etching or grinding so as to expose the first conductive metal 626, the center insulating material 627 and the first insulating material 621.

Figure 64:
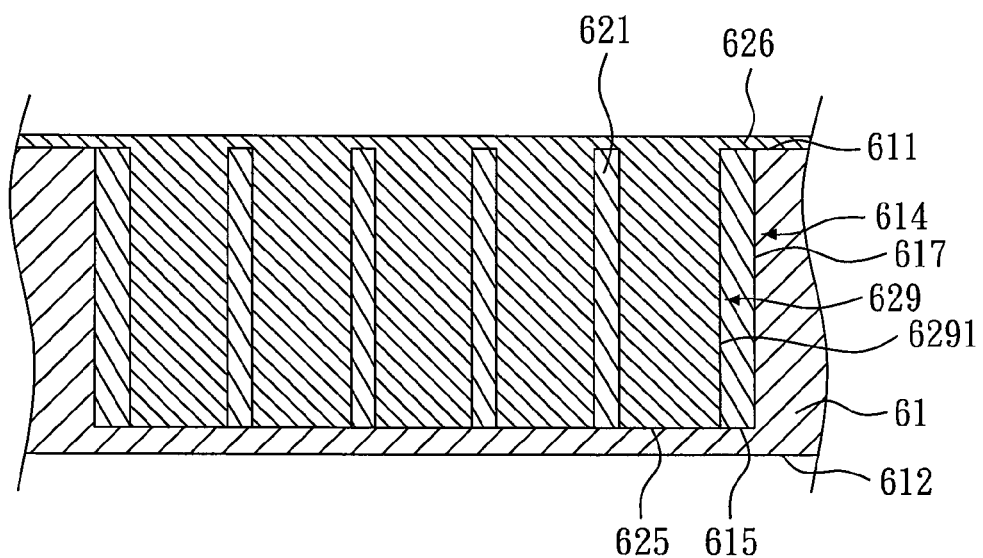
Figure 65:
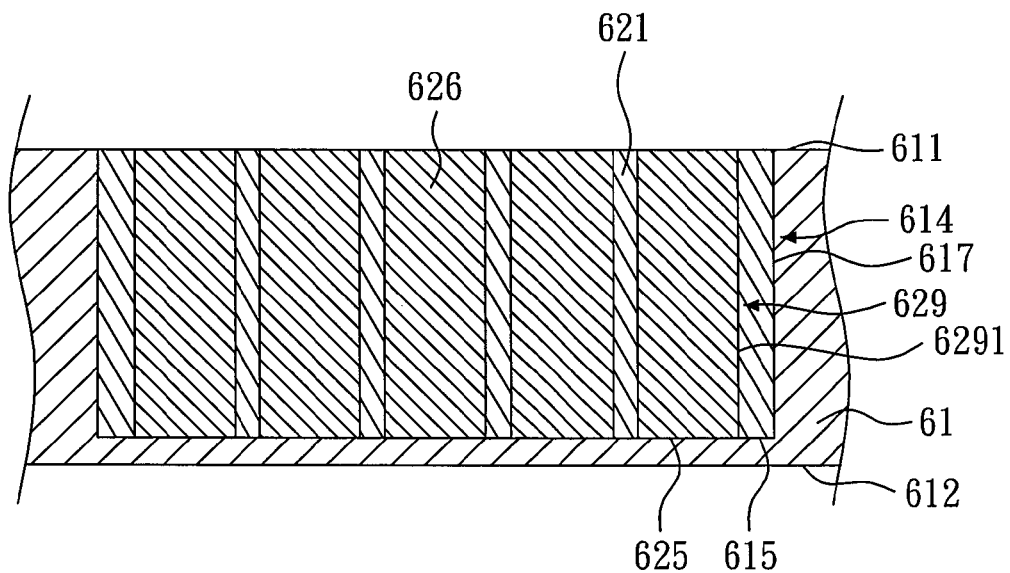
Figure 66:
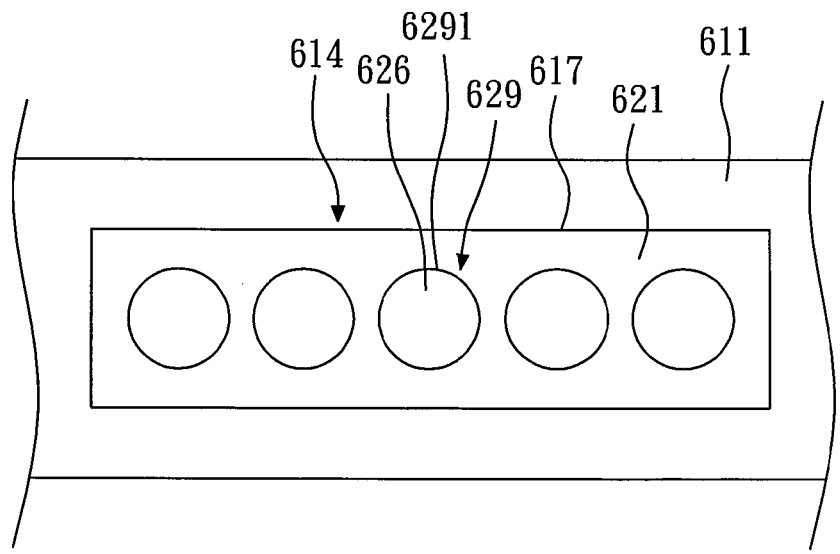

Referring to FIG. 58, the first conductive metal 626 does not fill the grooves 629. However, in other embodiment, as shown in FIG. 64, the first conductive metal 626 fills the grooves 629. Therefore, the center insulating material 627 is omitted, and the first conductive metal 626 forms a plurality solid pillars. Then, referring to FIGS. 65 and 66, part of the first conductive metal 626 which is outside the grooves 629 is removed. Afterward, referring to FIG. 67, part of the first surface 611 and part of the second surface 612 of the substrate 61 are removed by etching or grinding so as to expose the first conductive metal 626, and the first insulating material 621.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for forming a via in a substrate, comprising:
   (a) providing the substrate having a first surface and a second surface;
   (b) forming an accommodating groove and a plurality of pillars on the first surface of the substrate, the accommodating groove having a side wall and a bottom wall, the pillars remaining on the bottom wall of the accommodating groove, wherein the pillars are solid cylinders, and there is a completely empty space between the pillars;
   (c) forming a first insulating material in the accommodating groove and between the pillars;
   (d) removing all of the pillars completely so as to form a plurality of grooves in the first insulating material, wherein the grooves are spaced apart from each other; and
   (e) forming a first conductive metal in the grooves.

2. The method as claimed in claim 1, wherein the accommodating groove is rectangular from top view.

3. The method as claimed in claim 1, wherein each of the pillars is a part of the substrate, and the top surfaces of the pillars are coplanar with the first surface of the substrate.

4. The method as claimed in claim 1, wherein the accommodating groove and the pillars are formed at the same time.

5. The method as claimed in claim 1, wherein Step (b) comprises:
   (b1) forming a first photo resist layer on the first surface of the substrate;
   (b2) forming a first pattern on the first photo resist layer, wherein the first pattern comprises a first opening and a plurality of inner areas, the inner areas are located within the first opening and spaced apart from each other; and
   (b3) forming the accommodating groove and the pillars on the substrate according to the first pattern, wherein the accommodating groove corresponds to the first opening, and the pillars correspond to the inner areas.

6. The method as claimed in claim 5, wherein the first opening is rectangular and the inner areas are circular from top view.

7. The method as claimed in claim 1, wherein Step (c) comprises:
   (c1) dispersing a polymer at a position corresponding to the accommodating groove;
   (c2) impelling the polymer into the accommodating groove by vacuuming so as to form the first insulating material; and
   (c3) removing the polymer which is outside the accommodating groove.

8. The method as claimed in claim 1, wherein Step (c) comprises:
   (c1) atomizing and depositing a polymer in the accommodating groove by spray coating so as to form the first insulating material; and
   (c2) removing the polymer which is outside the accommodating groove.

9. The method as claimed in claim 1, wherein Step (d) comprises:
   (d1) forming a second photo resist layer on the first surface of the substrate;
   (d2) forming a plurality of second openings on the second photo resist layer, wherein the positions of the second openings correspond to the pillars; and
   (d3) removing the pillars according to the second openings so as to form the grooves.

10. The method as claimed in claim 9, wherein the sizes of the second openings are equal to those of the pillars.

11. The method as claimed in claim 1, wherein in Step (e), the first conductive metal fills the grooves.

12. The method as claimed in claim 1, wherein in Step (d), each of the grooves has a side surface and a bottom surface; in Step (e), the first conductive metal is formed on the side surfaces and the bottom surfaces of the grooves so as to form a plurality of central grooves.

13. The method as claimed in claim 12, further comprising a step of forming a center insulating material in the central grooves after Step (e).

14. The method as claimed in claim 13, wherein the center insulating material is formed by the following steps of:
dispersing a polymer at a position corresponding to the central grooves; and
impelling the polymer into the central grooves by vacuuming so as to form the center insulating material.

15. The method as claimed in claim 13, wherein the center insulating material is formed by the following steps of:
forming a plurality of vents so as to connect the central grooves to the second surface of the substrate;
dispersing a polymer at a position corresponding to the central grooves; and
filling the central grooves and the vents with the polymer so as to form the center insulating material.

16. The method as claimed in claim 1, further comprising a step of removing part of the second surface of the substrate to expose the first conductive metal after Step (e).

* * * * *